(12) United States Patent
Taniguchi

(10) Patent No.: US 10,825,746 B2
(45) Date of Patent: Nov. 3, 2020

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Katsumi Taniguchi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/377,084

(22) Filed: Apr. 5, 2019

(65) Prior Publication Data

US 2019/0355632 A1 Nov. 21, 2019

(30) Foreign Application Priority Data

May 16, 2018 (JP) .................................. 2018-094976

(51) Int. Cl.
| | | |
|---|---|---|
| H01L 23/043 | (2006.01) | |
| H01L 21/52 | (2006.01) | |
| H01L 25/07 | (2006.01) | |
| H01L 23/373 | (2006.01) | |
| H01L 23/00 | (2006.01) | |

(Continued)

(52) U.S. Cl.
CPC ............ *H01L 23/043* (2013.01); *H01L 21/52* (2013.01); *H01L 23/3121* (2013.01); *H01L 23/3735* (2013.01); *H01L 24/32* (2013.01); *H01L 25/0655* (2013.01); *H01L 25/072* (2013.01);

(Continued)

(58) Field of Classification Search
CPC ............... H01L 23/043; H01L 23/5385; H01L 23/3121; H01L 23/3735; H01L 21/52; H01L 25/115; H01L 25/0655; H01L 25/072; H01L 24/32; H01L 2224/32225

See application file for complete search history.

(56) References Cited

U.S. PATENT DOCUMENTS

| | | | | |
|---|---|---|---|---|
| 2013/0112994 A1* | 5/2013 | Sawada | ................. | H01L 23/049 257/77 |
| 2017/0018524 A1* | 1/2017 | Nashida | ................. | H01L 24/16 |

(Continued)

FOREIGN PATENT DOCUMENTS

| | | |
|---|---|---|
| JP | H09-027590 A | 1/1997 |
| JP | 2011-077280 A | 4/2011 |

(Continued)

*Primary Examiner* — Joseph C. Nicely
(74) *Attorney, Agent, or Firm* — Chen Yoshimura LLP

(57) ABSTRACT

The present invention includes: a plurality of semiconductor modules on a metal base (conductor base); a first insulating bus bar and a second insulating bus bar connecting the semiconductor modules; a box-like insulating resin frame around the semiconductor modules; a first insulating layer that seals the semiconductor modules, the first insulating layer having an upper surface at a position that is lower than upper ends of terminals extending from an insulating circuit substrate of the semiconductor module inside the insulating resin frame; and second insulating layers on the first insulating layer inside the insulating resin frame, the upper ends of the terminals being buried inside the second insulating layers. Interfaces formed by the first insulating layer, second insulating layers, and sidewall parts (third insulating layer) of the insulating resin frame are arranged between the terminals and ground positions formed at the lower ends of the sidewall parts.

15 Claims, 19 Drawing Sheets

(51) Int. Cl.
*H01L 25/11* (2006.01)
*H01L 25/065* (2006.01)
*H01L 23/31* (2006.01)

(52) U.S. Cl.
CPC .. *H01L 25/115* (2013.01); *H01L 2224/32225* (2013.01)

(56) References Cited

U.S. PATENT DOCUMENTS

| | | | |
|---|---|---|---|
| 2018/0053744 A1 | 2/2018 | Taniguchi | |
| 2018/0286779 A1* | 10/2018 | Iwamoto | H01L 23/3675 |
| 2019/0287887 A1* | 9/2019 | Nakamura | H01L 24/33 |
| 2020/0091130 A1* | 3/2020 | Taniguchi | H01L 25/18 |
| 2020/0177180 A1* | 6/2020 | Tanaka | H01L 29/1033 |
| 2020/0219782 A1* | 7/2020 | Hitomi | H01L 24/48 |

FOREIGN PATENT DOCUMENTS

| | | | | |
|---|---|---|---|---|
| JP | 2015-198227 A | 11/2015 | | |
| JP | 2018-029141 A | 2/2018 | | |
| WO | WO-2013145619 A1 * | 10/2013 | | H01L 23/043 |
| WO | WO-2014185050 A1 * | 11/2014 | | H01L 23/492 |

* cited by examiner

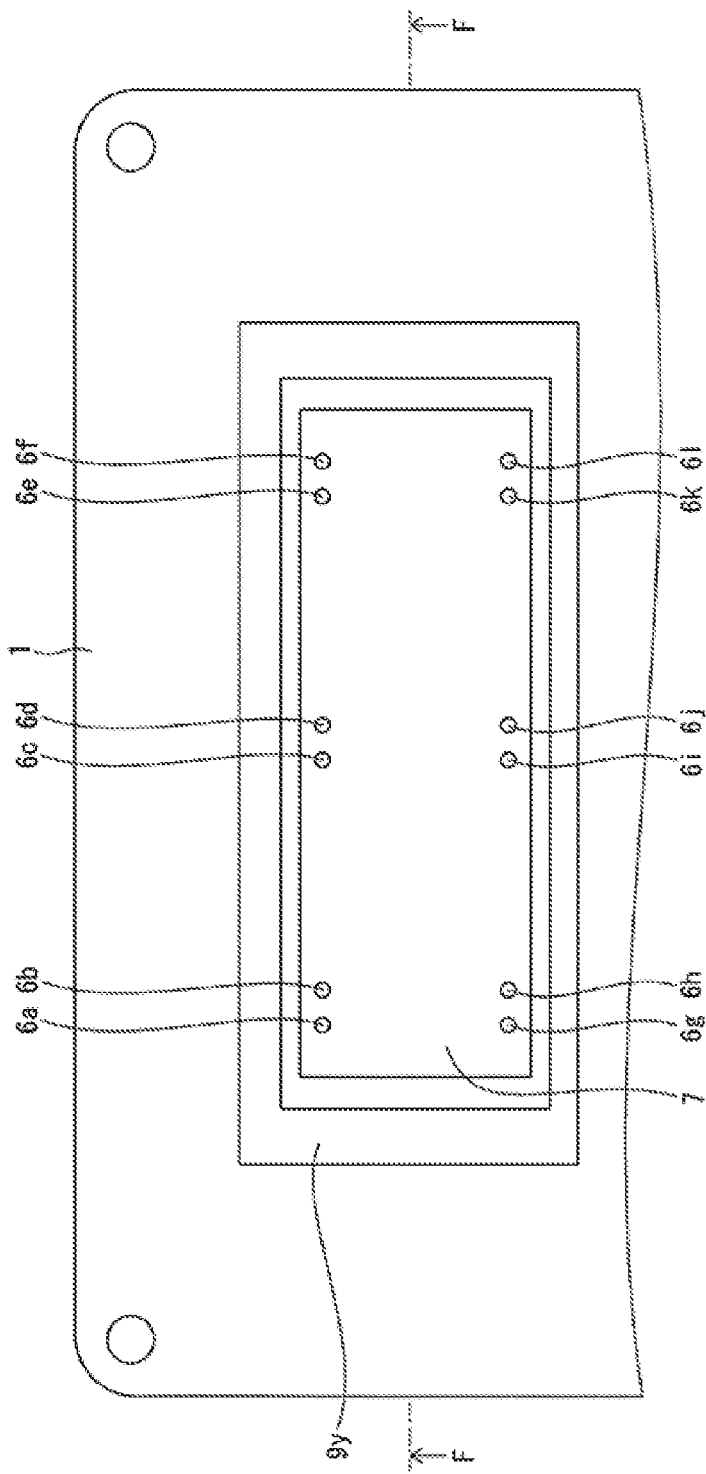

SEMICONDUCTOR DEVICE AND METHOD OF MANUFACTURING SEMICONDUCTOR DEVICE

BACKGROUND OF THE INVENTION

Technical Field

The present invention relates to a semiconductor device, and particularly to a power semiconductor device on which is mounted a plurality of wide bandgap semiconductor elements that use a wide bandgap semiconductor such as silicon (Si), silicon carbide (SiC), or gallium nitride (GaN), and to a method of manufacturing this semiconductor device.

Background Art

In large-capacity power semiconductor devices, a plurality of units are connected in parallel to increase power capacity, with each of those units being defined as a semiconductor module where a semiconductor chip is mounted on an insulating circuit substrate. If small-sized semiconductor modules having a low current capacity per module are prepared in this manner, then it is possible to manufacture a large-capacity semiconductor device by connecting in parallel the number of modules corresponding to the desired power capacity requested by the customer; thus, it is possible to reduce costs by manufacturing and keeping in stock semiconductor devices with differing power capacities. In connecting each semiconductor module in parallel, the terminals extending from the insulating circuit substrate of each semiconductor module, such as the emitter-side terminal, collector-side terminal, and output terminal, are electrically connected to one another by an insulating bus bar electrode or the like, for example.

One method of connecting a plurality of semiconductor modules in parallel to form a semiconductor device is to mount and connect the plurality of semiconductor modules on a conductor base, such as copper (Cu) or aluminum silicon carbide (AlSiC). A ceramic insulating substrate or the like on which conductor foil such as Cu or aluminum (Al) is formed on both surfaces thereof is used as the insulating circuit substrate, for example.

In this method where a conductor base is used, a circuit pattern is formed on the conductor foil on the surface of the ceramic insulating substrate opposite to the conductor base, and a plurality of power semiconductor elements are mounted on the conductor foil where the circuit pattern is formed. Examples of the power semiconductor elements include insulated gate bipolar transistors (IGBTs), metal oxide semiconductor field effect transistors (MOSFETs), diodes, or the like.

Specifically, first, before mounting the semiconductor modules on the conductor base, the power semiconductor elements, and the power semiconductor elements and the conductor foil are electrically connected by a bonding wire or the like that is fabricated by using a material such as Al or Cu. Thereafter, a resin case frame in which an electrode terminal is inserted is disposed around the semiconductor module, the power semiconductor elements and the conductor foil are connected so as to extract wiring to the outside. Inside the resin case frame, the power semiconductor elements and the bonding wire are protected by a soft insulating resin such as silicone gel, and the top of the resin case frame is covered with a resin lid.

The bottom surface of the ceramic insulating substrate is bonded onto the large conductor base to mount the plurality of semiconductor modules, thereby increasing the number of power semiconductor elements inside a single semiconductor device and increasing the power capacity of the rated current. The plurality of semiconductor modules are collectively sealed by a soft insulating resin such as silicone gel.

However, in the case of this method where a conductor base is used, if sealing is performed with a soft insulating resin such a silicone gel, which has low heat resistance, and partial discharge occurs inside a semiconductor device with a high rated voltage, then it is easy for a discharge crack referred to as a "tree" to develop inside the silicone gel, which easily leads to insulation breakdown.

Meanwhile, as a method for realizing a large power capacity semiconductor device without using a conductor base, there is a method where conductor foils such as Cu or Al are formed on both surfaces of a ceramic insulating substrate and a plurality of power semiconductor elements are mounted on one of the conductor foils in which a circuit pattern is formed. The surfaces of the plurality of power semiconductor elements and the conductor foil where the circuit pattern is formed can be electrically connected by using a circuit substrate in which pin terminals or the like have been inserted, for example. Furthermore, a lead terminal that is electrically connected to the conductor foil is used as an electrode terminal to the outside, and the semiconductor module is molded with a hard insulating resin such as an epoxy resin so as to expose the lead terminal and the conductor surface of the surface of the ceramic insulating substrate where the power semiconductor elements are not bonded.

In this method where a conductor base is not used, the use of a hard insulating resin for a semiconductor device (semiconductor module) molded with a hard insulating resin such as an epoxy resin reduces problems related to heat resistance and insulation resistance. However, if the size of the semiconductor device (semiconductor module) is increased in correspondence with an increase in capacity of the rated current, then the amount of hard resin material used will increase. Due to this, there is a worsening of the problem of residual stress caused by contraction during thermal curing and the difference in linear expansion coefficient with other members, and a worsening of the problem of a drop in insulation performance caused by internal non-filling of resin.

Normally, the material, shape, dimensions, etc. of the resin for molding the semiconductor module are set so as to be able to ignore the insulation distance between terminals in the unit and between the terminals and ground required in accordance with the rated voltage of the semiconductor device. However, in a case where the size of the semiconductor module of one unit is small, attempting to increase the rated voltage will lead to difficulty in ensuring the insulation distance (creepage distance and spatial distance) between the terminals in the semiconductor module of the same unit or the insulation distance between the terminals and ground.

In particular, in the case of a power semiconductor device that uses wide bandgap power semiconductor elements with a high withstand voltage, insulation characteristics for higher withstand voltages are also needed for the constituent members other than the semiconductor elements. In addition, on the occasion of a defect such as cracking or detachment occurring inside the sealing resin due to a heat cycle or the like, a short will occur in a case where the insulation distance between the terminals or between the terminals and ground is insufficient for the insulation distance corresponding to the rated voltage of the semiconductor device, and insulation breakdown will easily occur.

As a countermeasure, in examining technology that could be applied with the aim of improving insulation breakdown resistance in semiconductor devices that are resin-sealed, Patent Document 1, for example, discloses a semiconductor device provided with a pair of facing walls that are orthogonal to the longitudinal direction of a cuboid-shaped insulating case. In this semiconductor device, resin is not filled into the hollow section sandwiched by the walls, but rather the upper end of an external lead-out terminal protrudes out from the upper part of each region filled with resin on the left and right of this hollow section. By not filling resin into the hollow section, the amount of change in dimension due to expansion and contraction is halved, and mechanical stress on the internal structure is reduced.

Patent Document 2 forms a sealing resin of a semiconductor module with two levels of layers by using both a hard resin and a soft resin, thereby providing the power semiconductor module with high withstand voltage characteristics and high reliability.

Patent Document 3 discloses a semiconductor device in which a part of a surface on the upper part of a resin sealing body is provided with a recess that is opened on the upper side and a terminal is inserted into this recess so as to expose the upper end of the terminal. In Patent Document 3, the terminal being exposed from the recess reduces tensile stress generated in the vicinity of the surface of the resin sealing body from being concentrated on the boundary between the resin sealing body and the terminal, thus improving mechanical reliability. Furthermore, in Patent Document 3, the boundary between the section of the terminal exposed from the resin sealing body and the sealing resin body is formed so as to recede toward the lower side, which is the circuit surface side, thus ensuring creepage distance on the surface of the sealing resin and increasing insulating characteristics. The reason for this is thought to be because the inclined surface of the recess is provided continuously on the horizontal surface of the sealing resin, and thus the creepage distance is longer than a case where the interface is formed with only a horizontal surface.

Patent Document 4 discloses a semiconductor device having: a plurality of semiconductor units, each semiconductor unit having a semiconductor element, a unit case that seals the semiconductor elements, and a first unit terminal exposed in a first recess provided on the upper surface of the unit case; first unit connection parts having first connection terminals connected to the first unit terminals of each of the corresponding plurality of semiconductor units, first connection conductors connecting the plurality of first connection terminals, and a first connection conductor sealing part that seals the first connection conductors and exposes the plurality of first connection terminals; and a plurality of first recess sealing parts that respectively seal connection parts between the first unit terminals and the first connection terminals in the recess of the first recesses of each of the corresponding plurality of semiconductor units.

However, in the case of Patent Document 1, there is consideration given to reducing mechanical stress, but no consideration at all given to inhibiting insulation breakdown caused by cracks or the like that have occurred inside the sealing resin due to a heat cycle or the like, as described above.

In the case of Patent Document 2, similarly to Patent Document 1, no consideration is given to inhibiting insulation breakdown caused by cracks or the like that have occurred inside the sealing resin. Furthermore, Patent Document 2 discloses three terminals that are provided inside the same unit separated from each other and that each protrude from the lid of the case, but there is only an empty space between the upper ends of terminals, and no consideration at all is given to the insulation distance between terminals.

In addition, as in Patent Document 3, in a case where an interface is formed by an inclined surface being continuous on the horizontal surface of a sealing resin, it is possible to extend the creepage distance by some extent, but the length of actual extension is extremely small compared to the distance between terminals. Thus, it cannot be said that a sufficient insulation distance between terminals has been ensured, and there is a concern whether insulating characteristics that are required for practical use have been reliably secured.

RELATED ART DOCUMENTS

Patent Documents

Patent Document 1: Japanese Patent Application Laid-Open Publication No. H09-027590

Patent Document 2: Japanese Patent Application Laid-Open Publication No. 2015-198227

Patent Document 3: Japanese Patent Application Laid-Open Publication No. 2011-077280

Patent Document 4: Japanese Patent Application Laid-Open Publication No. 2018-029141

SUMMARY OF THE INVENTION

The present invention was made in view of the aforementioned problems and aims at providing a semiconductor device that has a plurality of parallel-connected semiconductor units, the entirety of which are resin-sealed on a conductor base, and that improves insulation breakdown resistance more than conventional configurations, and a method of manufacturing this semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a conductor base; a plurality of identical semiconductor units mounted on the conductor base, each of the semiconductor units including a semiconductor module and a box-shaped insulating resin frame that encloses the semiconductor module; and a bus bar connecting the plurality of semiconductor units in parallel to each other, wherein the semiconductor module includes: an insulating circuit substrate mounted on the conductor base, semiconductor chips mounted on the insulating circuit substrate, and rod-shaped terminals provided on the insulating circuit substrate and connected to the semiconductor chips, the rod-shaped terminals vertically extending upwardly away from the conductor base, wherein the box-shaped insulating resin frame is mounted on the conductor base so as to enclose the semiconductor module, and the conductor base in contact with a bottom of a sidewall of the insulating resin frame is a grounded portion, wherein each of the semiconductor units further includes: a first insulating member that fills in a space defined by the insulating resin frame and the semiconductor module enclosed therein so as to seal the semiconductor module, an upper surface of the first insulating member being positioned at a level that is lower than upper end portions of the rod-shaped terminals, thereby exposing the upper end portions of the respective rod-shaped terminals from the first insulating member, the exposed upper end portions of the respective rod-shaped being connected to the bus bar; and a second insulating member that fills in an inside of the insulating resin frame on the first insulating member so as to seal and bury the upper end portions of the rod-shaped terminals that are connected to the bus bar, and wherein in each of the semiconductor units, one or more of an interface between the first insulating member and the second insulating member, an interface between the first insulating member and the insulating resin frame, and an interface between the second insulating member and the insulating resin frame are arranged between two adjacent ones of the rod-shaped terminals and between any of the rod-shaped terminals and the grounded portion.

In another aspect, the present disclosure provides a method of manufacturing a semiconductor device, including: mounting, on a conductor base, a plurality of identical semiconductor modules, each of the semiconductor modules including an insulating circuit substrate, semiconductor chips mounted on the insulating circuit substrate, and rod-shaped terminals provided on the insulating circuit substrate and connected to the semiconductor chips, the rod-shaped terminals vertically extending upwardly away from the conductor base; arranging a plurality of box-shaped insulating resin frame on the conductor base so as to respectively enclose the semiconductor modules and bonding the insulating resin frames to the conductor base; in each of the insulating resin frames, forming a first insulating member that fills in a space defined by the insulating resin frame and the semiconductor module enclosed therein so as to seal the semiconductor module, an upper surface of the first insulating member being positioned at a level that is lower than upper end portions of the rod-shaped terminals, thereby exposing the upper end portions of the respective rod-shaped terminals from the first insulating member; connecting the exposed upper end portions of the corresponding rod-shaped terminals of the plurality of semiconductor module by a bus bar so as to connect the plurality of semiconductor modules in parallel to each other; and in each of the insulating resin frames, forming a second insulating member that fills in an inside of the insulating resin frame on the first insulating member so as to seal and bury the upper end portions of the rod-shaped terminals that are connected to the bus bar, wherein the method is performed such that in each of the insulating resin frames, one or more of an interface between the first insulating member and the second insulating member, an interface between the first insulating member and the insulating resin frame, and an interface between the second insulating member and the insulating resin frame are arranged between two adjacent ones of the rod-shaped terminals and between any of the rod-shaped terminals and the grounded portion.

The present invention makes it possible to provide a semiconductor device that has a plurality of parallel-connected semiconductor units, the entirety of which are resin-sealed on a conductor base, and that improves insulation breakdown resistance more than conventional configurations, and a method of manufacturing this semiconductor device.

It is to be understood that both the foregoing general description and the following detailed description are exemplary and explanatory, and are intended to provide further explanation of the invention as claimed.

BRIEF DESCRIPTION OF THE DRAWINGS

FIG. 19 is a cross-sectional view for schematically describing the outline of a configuration of a semiconductor device according to Embodiment 2 of the present invention.

DETAILED DESCRIPTION OF EMBODIMENTS

Figure 1:
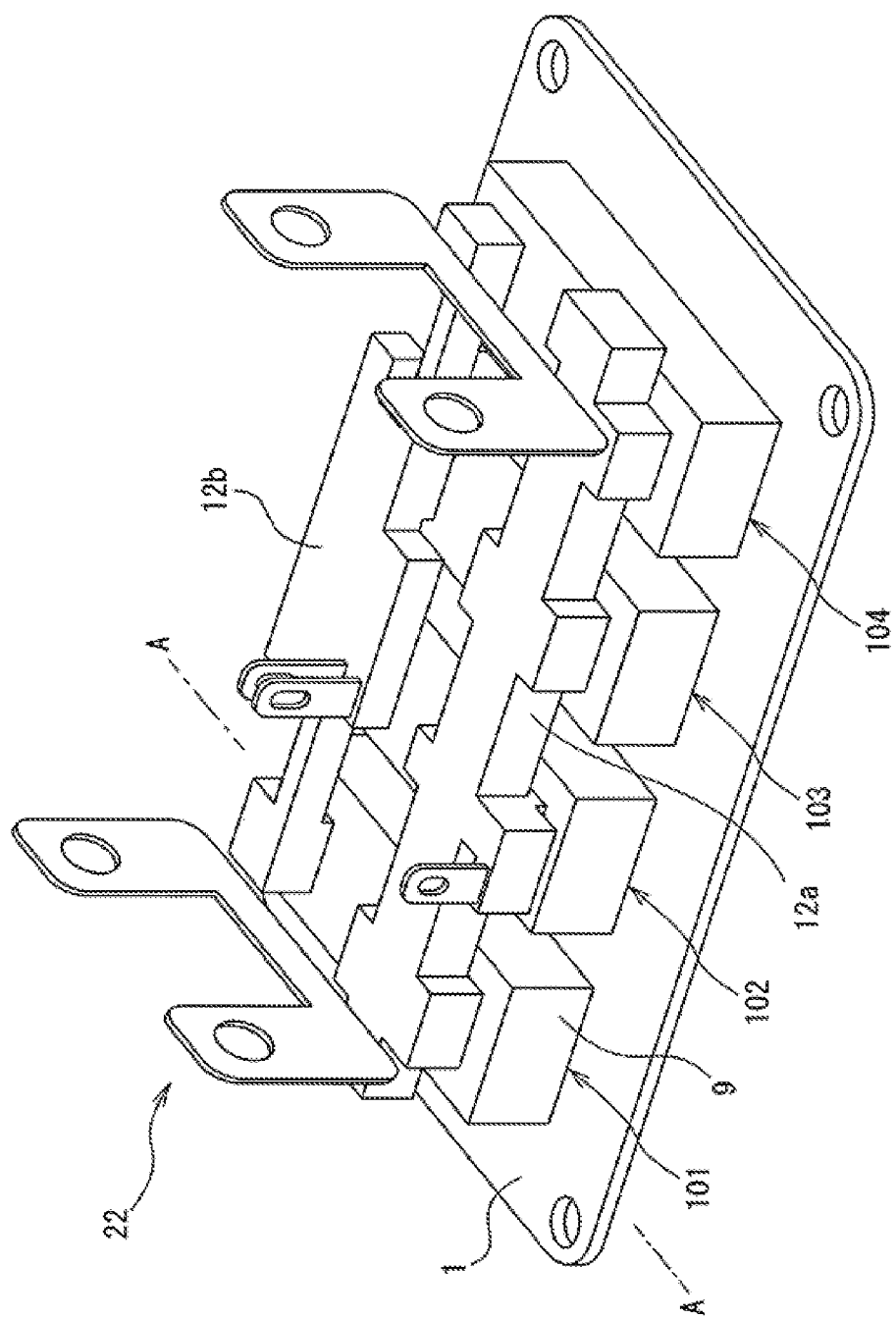
FIG. 1 is a perspective view (bird's-eye view) for schematically describing the outline of a configuration of a semiconductor device according to Embodiment 1 of the present invention.

Embodiments 1 and 2 of the present invention will be described below. In the drawings, parts that are the same or similar will be assigned the same or similar reference characters. However, it should be noted that the drawings are schematic, and that the relationship between thickness and the planar dimensions and the proportions or the like among the thicknesses of each device and each member differ in practice. Thus, specific thicknesses and dimensions should be determined in reference to the description below. Furthermore, it goes without saying that there are parts that differ in the dimensional relationships and proportions thereof among the drawings.

In addition, the directions of "left-right" and "top-bottom" in the description below are merely definitions for convenience of explanation and do not limit the technical spirit of the present invention. Accordingly, if the sheet of paper were turned by 90 degrees, for example, then "left and right" and "top and bottom" would be switched, and if the sheet of paper were rotated 180 degrees, then naturally "left" would become "right" and "right" would become "left."

Embodiment 1

—Semiconductor Device—

As shown in FIG. 1, a semiconductor device according to Embodiment 1 of the present invention includes, for example, a metal base 1 that forms a conductor base, and four semiconductor units 101, 102, 103, 104 bonded onto the metal base 1. The four semiconductor units 101, 102, 103, 104 are all cuboid-shaped, arranged at equal intervals along the short-side direction, and connected in parallel by a first insulating bus bar 12a and a second insulating bus bar 12b. Plate-shaped conductor parts 22 used as external electrodes are provided on the upper parts of the first insulating bus bar 12a and second insulating bus bar 12b so as to protrude upward. The four semiconductor units 101, 102, 103, 104 have mutually equivalent configurations, and thus the configuration of the four semiconductor units 101, 102, 103, 104 will be described below using the left back-side semiconductor unit 101 in FIG. 1 as a representative example.

Figure 2:
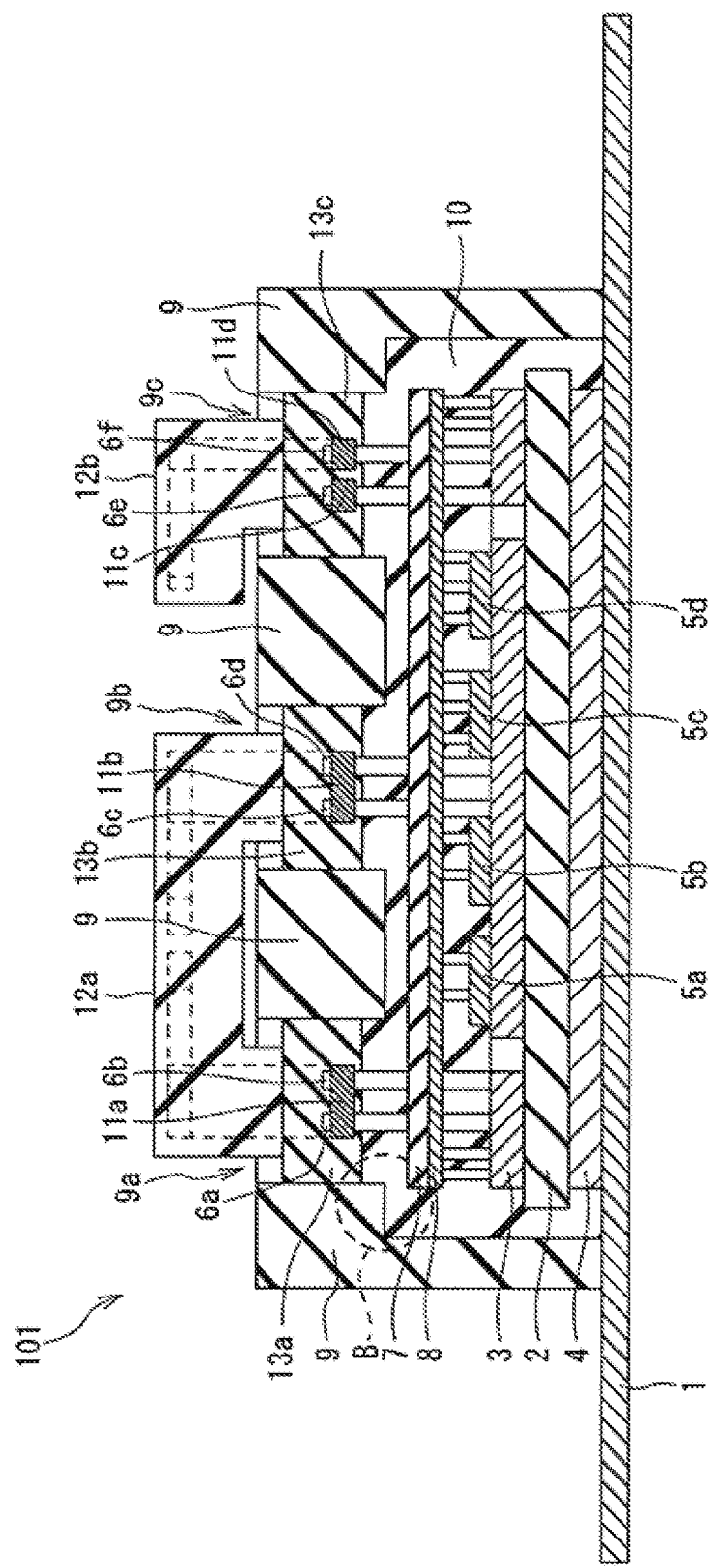
FIG. 2 is a cross-sectional view of a case where the cross section of semiconductor units of the semiconductor device according to Embodiment 1 is taken in a plane that is perpendicular to the main surface of a metal base and that includes the A-A line in FIG. 1.

As shown in FIG. 2, the semiconductor unit 101 includes an insulating circuit substrate (2, 3, 4), and semiconductor chips 5a, 5b, 5c, 5d mounted on the insulating circuit substrate (2, 3, 4). The semiconductor chips 5a, 5b, 5c, 5d are electrically connected to an upper circuit substrate (7, 8) by pin terminals that extend downward to the insulating circuit substrate (2, 3, 4) from the lower surface of the upper circuit substrate (7, 8), which is provided above the insulating circuit substrate (2, 3, 4).

The insulating circuit substrate (2, 3, 4) can be a structure such as a copper bonded substrate in which a conductor foil such as Cu or Al is provided as a front surface conductive foil 3 and a rear surface conductive foil 4 on the upper surface and lower surface, respectively, of an insulating substrate 2. DCB (direct copper bonding) substrates and AMB (active metal brazing) substrates are known to be representative examples of a copper bonded substrate.

The insulating substrate 2 can be fabricated with the main material thereof being, for example, alumina ($Al_2O_3$) ceramic, aluminum nitride (AlN), silicon nitride ($Si_3N_4$) ceramic, or the like. The front surface conductive foil 3 is formed in the desired pattern, and power semiconductor elements made of a semiconductor material such as Si, SiC, or GaN are bonded onto the front surface conductive foil 3 as the semiconductor chips 5a, 5b, 5c, 5d. The layered structure and arrangement state of the semiconductor regions inside the semiconductor chips 5a, 5b, 5c, 5d are not shown in the drawings.

Figure 4:
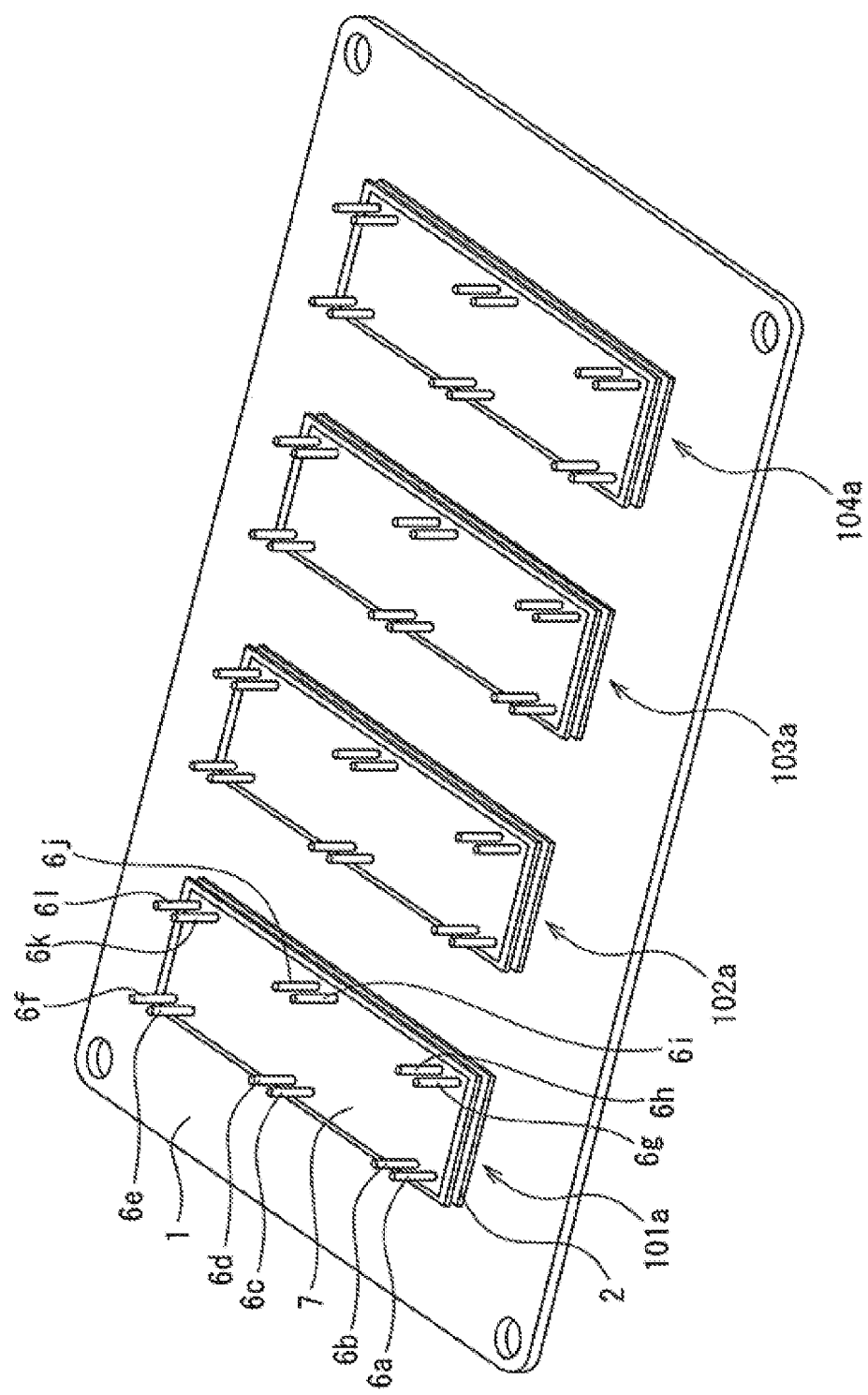
FIG. 4 is a perspective view of a step in a method of manufacturing the semiconductor device according to Embodiment 1 (first example).
Figure 5:
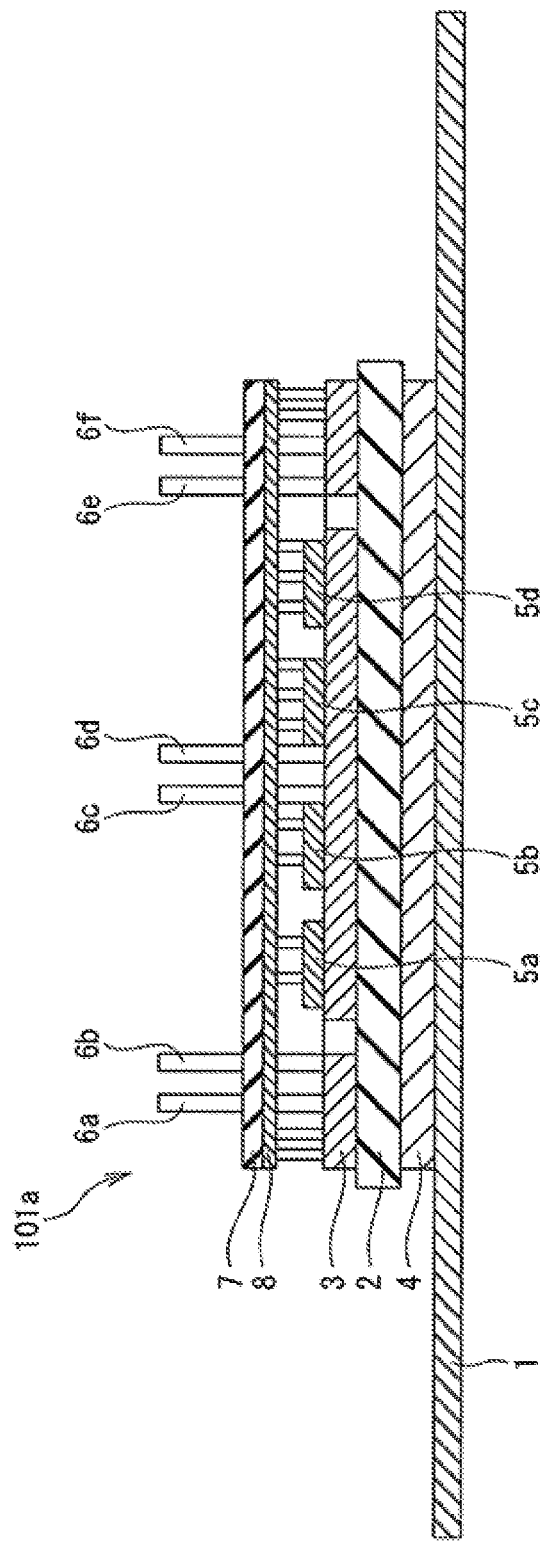
FIG. 5 is a cross-sectional view of a step in the method of manufacturing the semiconductor device according to Embodiment 1.

The upper circuit substrate (7, 8) has an insulating plate 7, and a circuit pattern 8, which is a metal film provided on the lower surface of the insulating plate 7. The upper circuit substrate (7, 8) connects the respective corresponding electrodes of the four semiconductor chips 5a, 5b, 5c, 5d mounted on the one insulating circuit substrate (2, 3, 4). The upper circuit substrate (7, 8) connects the electrodes of the semiconductor chips 5a, 5b, 5c, 5d to the respective corresponding external terminals among first unit terminals 6a, 6b, second unit terminals 6c, 6d, and third unit terminals 6e, 6f, which are external terminals. As shown in FIG. 4, which will be described later, in practice the semiconductor unit 101 is provided with four first unit terminals 6a, 6b, 6g, 6h, four second unit terminals 6c, 6d, 6i, 6j, and four third unit terminals 6e, 6f, 6k, 6l.

As shown in FIG. 2, the first unit terminals 6a, 6b, 6g, 6h, second unit terminals 6c, 6d, 6i, 6j, and third unit terminals 6e, 6f, 6k, 6l are rod-shaped, are all electrically connected to the semiconductor chips 5a, 5b, 5c, 5d on the insulating circuit substrate (2, 3, 4), and extend toward the upper side, which is opposite side of the metal base 1. The lower ends of the first unit terminals 6a, 6b, 6g, 6h, second unit terminals 6c, 6d, 6i, 6j, and third unit terminals 6e, 6f, 6k, 6l are all connected to the front surface conductive foil 3 of the insulating circuit substrate (2, 3, 4) and to the circuit pattern 8 of the upper circuit substrate (7, 8) by solder bonding, ultrasonic bonding, or the like.

As shown in FIG. 4, the four first unit terminals 6a, 6b, 6g, 6h are arranged so as to form four corners of a rectangle with the respective upper end surfaces thereof, and all of the four first unit terminals form source terminals with the same potentials as one another, for example. The four first unit terminals 6a, 6b, 6g, 6h cause source current to be conducted between the semiconductor chips 5a, 5b, 5c, 5d and the outside of the semiconductor unit 101.

The four second unit terminals 6c, 6d, 6i, 6j are also arranged so as to form four corners of a rectangle with the respective upper end surfaces thereof, and all of the four second unit terminals form drain terminals with the same potentials as one another, for example. The four second unit terminals 6c, 6d, 6i, 6j cause drain current to be conducted between the semiconductor chips 5a, 5b, 5c, 5d and the outside of the semiconductor unit 101.

Similarly, the four third unit terminals 6e, 6f, 6k, 6l are also arranged so as to form four corners of a rectangle with the respective upper end surfaces thereof. The four third unit terminals 6e, 6f, 6k, 6l cause a control signal of the semiconductor unit 101 to be conducted between the semiconductor chips and the outside of the semiconductor unit 101. For example, the third unit terminal 6f on the right end in FIG. 2, and the third unit terminal 6l disposed to face this third unit terminal so as to form a long side of the rectangle with the third unit terminal 6f in FIG. 4, together form a gate terminal that conducts a gate signal. Furthermore, the third unit terminal 6e on the left side of the third unit terminal 6f in FIG. 2, and the third unit terminal 6k disposed to face this third unit terminal so as to form a long side of the rectangle with the third unit terminal 6e in FIG. 4, together form a source sensor terminal that is connected to the source electrode of the semiconductor chips 5a, 5b, 5c, 5d and detects a source signal, for example.

As shown in FIG. 1 and FIG. 2, the area around the insulating circuit substrate (2, 3, 4) and the upper circuit substrate (7, 8) is covered by a cuboid-shaped box-like insulating resin frame 9 that is fabricated of a hard insulating resin such as an epoxy resin, for example. The insulating resin frame 9 of the semiconductor device according to Embodiment 1 has four sidewall parts respectively provided along the four sides of the insulating circuit substrate (2, 3, 4), and a ceiling part provided on the four sidewall parts. As shown in FIG. 2, in the ceiling part, a first through-hole 9a, second through-hole 9b, and third through-hole 9c are provided at equal intervals along the longitudinal direction, all of which are through-holes.

The first unit terminal 6a and the first unit terminal 6b are provided in the first through-hole 9a on the left side of the ceiling part of the insulating resin frame 9 in FIG. 2 such that the respective upper end surfaces thereof are positioned approximately in the center between the upper surface and the lower surface of the ceiling part. Inside the second through-hole 9b in the center of the ceiling part, the second unit terminal 6c and the second unit terminal 6d are provided such that the respective upper end surfaces thereof are positioned approximately in the center between the upper surface and the lower surface of the ceiling part, similarly to inside of the first through-hole 9a. Inside the third through-hole 9c on the right side of the ceiling part, the third unit terminal 6e and the third unit terminal 6f are provided such that the respective end surfaces thereof are positioned approximately in the center between the upper surface and the lower surface of the ceiling part, similarly to inside of the first through-hole 9a and the second through-hole 9b.

The first unit terminal 6b on the right side inside the first through-hole 9a and the second unit terminal 6c on the left side inside the second through-hole 9b correspond to "one pair of terminals" in the present invention, which is given consideration to the insulation breakdown resistance between terminals. Furthermore, the second unit terminal 6d on the right side inside the second through-hole 9b and the third unit terminal 6e on the left side inside the third through-hole 9c also similarly correspond to "one pair of terminals" in the present invention, which is given consideration to the insulation breakdown resistance between terminals.

As shown in FIG. 2, a first insulating layer (insulating member) 10 is provided inside the insulating resin frame 9 so as to seal the insulating circuit substrate (2, 3, 4) and the upper circuit substrate (7, 8). The upper surface of the first insulating layer 10 is at a position that is lower than the upper ends of the first unit terminals 6a, 6b, second unit terminals 6c, 6d, and third unit terminals 6e, 6f, and the inside of the first insulating layer 10 includes the lower portions of the first unit terminals 6a, 6b, second unit terminals 6c, 6d, and third unit terminals 6e, 6f.

A second insulating layer (member) or layers 13a, 13b, 13c are provided on the upper surface of the first insulating layer 10 so as to seal the respective upper portions of the first unit terminals 6a, 6b, second unit terminals 6c, 6d, and third unit terminals 6e, 6f. The upper surfaces of the second insulating layers 13a, 13b, 13c are at positions that are higher than the upper ends of the first unit terminals 6a, 6b, second unit terminals 6c, 6d, and third unit terminals 6e, 6f, and lower than the upper surface of the insulating resin frame 9.

Figure 9:
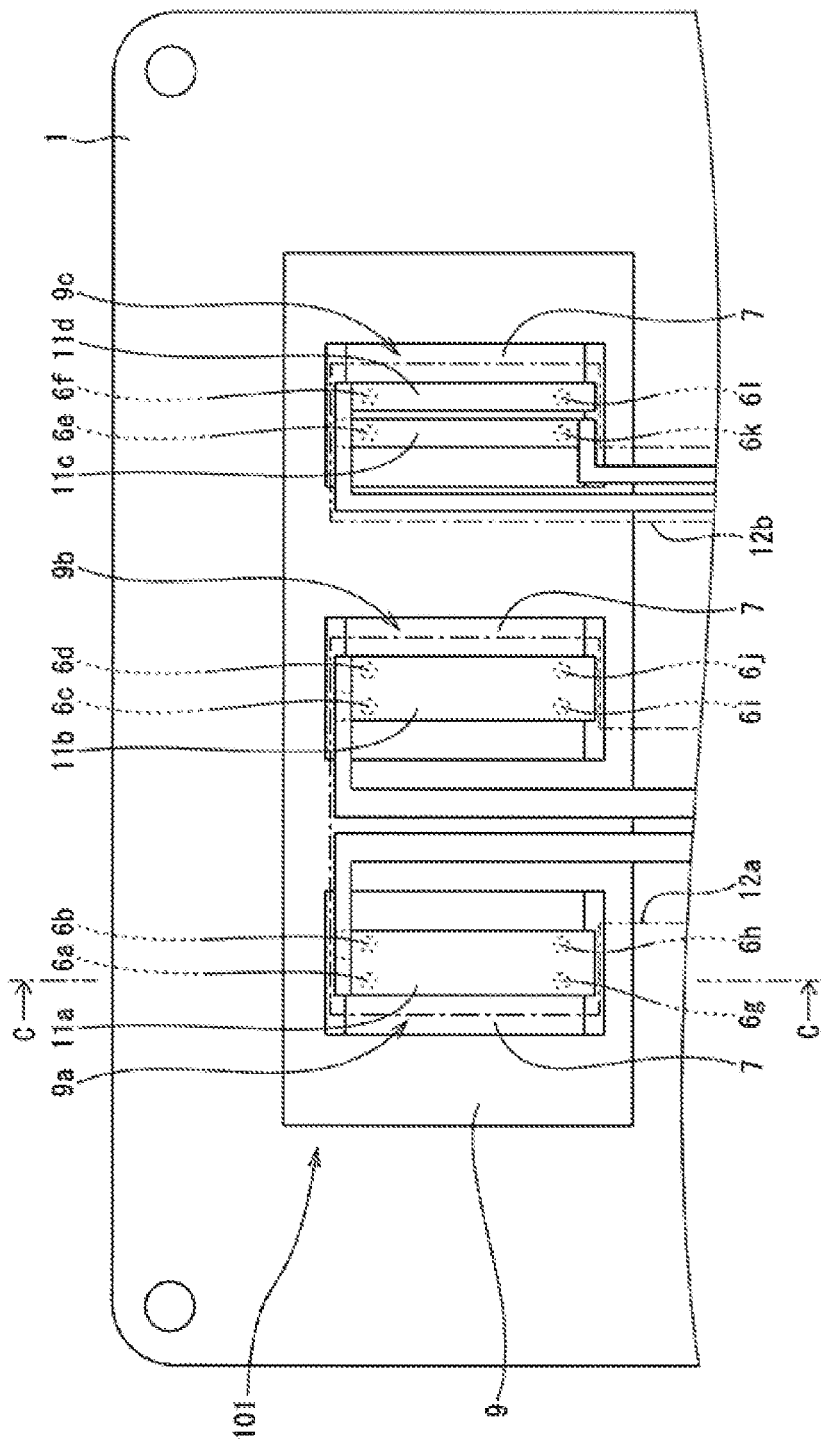
FIG. 9 is a plan view of a step in the method of manufacturing the semiconductor device according to Embodiment 1 (fourth example).

A first insulating bus bar 12a is provided on the second insulating layer 13a inside the first through-hole 9a and the second insulating layer 13b inside the second through-hole 9b so as to be bridged across the top of a beam part of the insulating resin frame 9 between the first through-hole 9a and the second through-hole 9b and such that both ends of the first insulating bus bar are inserted into respective through-holes. As shown in FIG. 9, which is described later, the first insulating bus bar 12a has, as member units, a connection part 11a and a connection part 11b, which are conductor parts exposed to outside. The connection part 11a has through-holes joined to the first unit terminals 6a, 6b, 6g, 6h, and the connection part 11b has through-holes joined to the second unit terminals 6c, 6d, 6i, 6j. The reference characters for these through-holes are not shown in FIG. 2, but the first insulating bus bar 12a is attached to the first unit terminals 6a, 6b and second unit terminals 6c, 6d via the through-holes. The first unit terminals 6a, 6b, 6g, 6h are press-fitted into the respective through-holes of the connection part 11a. The second unit terminals 6c, 6d, 6i, 6j are press-fitted into the respective through-holes of the connection part 11b.

The second insulating bus bar 12b is provided on the second insulating layer 13c inside the third through-hole 9c such that the lower part of the second insulating bus bar is inserted into the third through-hole. Similarly to the first insulating bus bar 12a, the second insulating bus bar 12b has, as member units, a connection part 11c and a connection part 11d, which are conductor parts exposed to outside. As shown in FIG. 9, the connection part 11c has through-holes joined to the third unit terminals 6e, 6k, and the connection part 11d has through-holes joined to the third unit terminals 6f, 6l. The third unit terminals 6e, 6k are press-fitted into the respective through-holes of the connection part 11c. The third unit terminals 6f, 6l are press-fitted into the respective through-holes of the connection part 11d.

The sidewall parts of the insulating resin frame 9 in Embodiment 1 correspond to the "third insulating layer" of the present invention, and the beam part of the insulating resin frame 9 corresponds to the "fourth insulating layer" of the present invention. The sidewall parts and beam part of the insulating resin frame 9 are provided so as to be separated from the respective unit terminals forming the "one pair of terminals" among the first unit terminals 6a, 6b, second unit terminals 6c, 6d, and third unit terminals 6e, 6f. Furthermore, as shown in FIG. 2, the sidewall parts and beam part of the insulating resin frame 9 have respective interfaces between the first insulating layer 10 and the second insulating layers 13a, 13b, 13c.

On the left side of the first unit terminal 6a on the left end in the first through-hole 9a in FIG. 2, the sidewall part on the left side of the insulating resin frame 9 adjacent to the first unit terminal 6a combines with the first insulating layer 10 and the second insulating layer 13a in order to form the interface between the sidewall part and the insulating layer. The lower ends of the sidewall parts of the insulating resin frame 9 joined with the metal base 1 form ground positions. As shown by section B in FIG. 2, a vertical interface is formed between the first insulating layer 10 and the sidewall parts of the insulating resin layer 9, which are the third insulating layer.

Furthermore, inside section B in FIG. 2, an interface is formed between the lower surface of the ceiling part of the insulating resin frame 9 and the first insulating layer 10, and this interface extends horizontally from the upper end position of the vertical interface to the right side. In addition, an interface is formed between the end surface of the inner wall of the ceiling part of the insulating resin frame 9 and the first insulating layer 10, and this interface extends vertically from the right end of the horizontal interface to the upper side. This vertical interface, in the middle of extending upward, meets orthogonally with a horizontal interface formed between the first insulating layer 10 and the second insulating layer 13a. In other words, the interfaces are formed such that there are three regions each bent at approximately 90 degrees between the first unit terminal 6a and ground. By arranging, in this manner, composite interfaces obtained by combining the first insulating layer 10, second insulating layers 13*a*, 13*b*, 13*c*, and sidewall parts of the insulating resin frame 9, which serves as the third insulating layer, the insulation distance between the first unit terminal 6*a* and ground is greatly extended.

Figure 3:
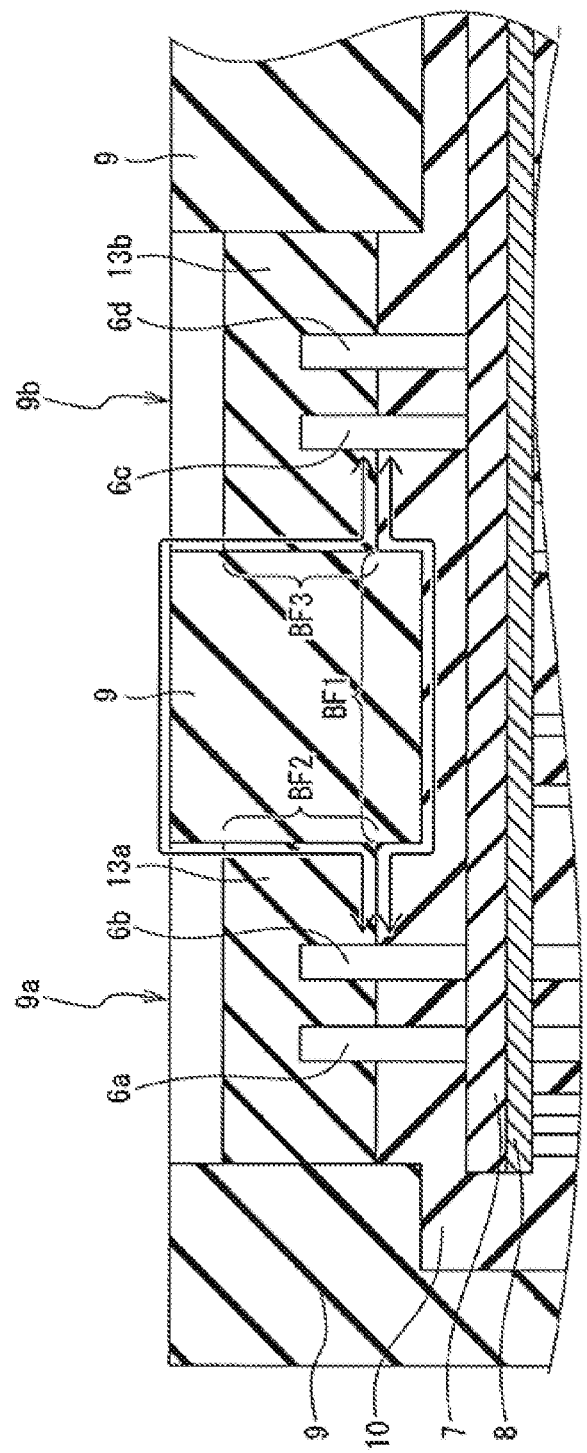
FIG. 3 is a cross-sectional view in which the left-side upper part in FIG. 2 has been partially enlarged.

Attention will be given to the beam part of the insulating resin frame 9, which is interposed between the first unit terminal 6*b* on the right side in the first through-hole 9*a* on the left side in FIG. 2 and the second unit terminal 6*c* on the left side inside the second through-hole 9*b*. As shown in FIG. 3 in which this beam part is enlarged, a first interface BF1, second interface BF2, and third interface BF3 are formed by the combination of the first insulating layer 10, second insulating layer 13*a* embedded inside the first through-hole 9*a*, second insulating layer 13*b* embedded inside the second through-hole 9*b*, and the beam part of the insulating resin frame 9, which serves as the fourth insulating layer. The first interface BF1 is formed between the first insulating layer 10 and the lower part of the beam part of the insulating resin frame 9. The second interface BF2 is formed between the second insulating layer 13*a* on the first through-hole 9*a* side and left-side surface in FIG. 3 of the beam part of the insulating resin frame 9, and the third interface BF3 is formed between the second insulating layer 13*b* on the second through-hole 9*b* side and the right-side surface in FIG. 3 of the beam part of the insulating resin frame 9.

On the upper side and lower side of the rectangular beam part in the center of FIG. 3, two bidirectional arrows are shown, each extending along the outer edges of the beam part. The two bidirectional arrows schematically show two types of creepage distances formed between the first unit terminal 6*b* on the left side of the beam part in FIG. 3 and the second unit terminal 6*c* on the right side by the first interface BF1, second interface BF2, and third interface BF3. As can be understood from the difference in length between the two bidirectional arrows, the beam part being interposed as the fourth insulating layer increases the creepage distance between the first unit terminal 6*b* and the second unit terminal 6*c* far more than the straight-line distance in a case where the shortest distance between both terminals is measured.

A case will be considered for the semiconductor unit 101 shown in FIG. 3 where a crack or detachment has occurred inside the second insulating layers 13*a*, 13*b*, 13*c* between the first unit terminal 6*b* and second unit terminal 6*c*, for example. Between the first unit terminal 6*b* and the second unit terminal 6*c*, interfaces have been formed in a composite manner through the combination of the first insulating layer 10, second insulating layers 13*a* to 13*c*, and the beam part, which is the fourth insulating layer. Due to this, even in a case where the straight-line distance is hypothetically shorter than the prescribed insulation distance for the rated voltage, the creepage distance between both terminals is greatly increased. Furthermore, the creepage distances between the terminals forming the "one pair of terminals" among the first unit terminals 6*a*, 6*b*, second unit terminals 6*c*, 6*d*, and third unit terminals 6*e*, 6*f* is also greatly increased, similarly to between the first unit terminal 6*b* and the second unit terminal 6*c*.

In this manner, in the semiconductor device according to Embodiment 1, the insulation distance between the terminals, and between the terminals and ground is extended by the combination of the first insulating layer 10, second insulating layers 13*a* to 13*c*, the sidewall parts serving as the third insulating layer, and the beam part serving as the fourth insulating layer. Due to this, even for a power semiconductor device with a rated voltage of 3.3 kV or above, for example, it is possible to provide the necessary insulation withstand voltage adapted to this rated voltage.

The semiconductor device according to Embodiment 1 makes it possible to ensure a large creepage distance between terminals and to greatly increase the resistance of the semiconductor unit 101 against insulation breakdown, due to the combination of the first insulating layer 10, the second insulating layers 13*a* to 13*c*, the sidewall parts serving as the third insulating layer, and the beam part serving as the fourth insulating layer. By mounting a plurality of the semiconductor units 101 with improved insulation resistance on the metal base 1 and connecting the units in parallel, it is possible to realize a semiconductor device that maintains high heat resistance and insulation and that has a high withstand voltage and large power capacity.

—Method of Manufacturing Semiconductor Device—

Next, a method of manufacturing the semiconductor device according to Embodiment 1 will be illustratively described using FIGS. 4 to 11. First, as shown in FIG. 4, the four semiconductor modules 101*a*, 102*a*, 103*a*, 104*a* are prepared, each of which includes the insulating circuit substrate (2, 3, 4) on which the semiconductor chips 5*a*, 5*b*, 5*c*, 5*d* are mounted and the upper circuit substrate (7, 8) connected to the insulating circuit substrate (2, 3, 4). A conductor circuit pattern is formed on the front surface conductive foil 3 on the ceramic insulating substrate 2 of the insulating circuit substrate (2, 3, 4).

Next, paste-like solder, for example, is used to print or coat via a dispenser or the like the element mounting positions on the front surface conductive foil 3, and the semiconductor chips 5*a*, 5*b*, 5*c*, 5*d*, which are semiconductor elements, are mounted thereon. A dispenser is used to coat the paste-like solder on the surfaces of the semiconductor elements where pin wiring is performed, and on the electrode bonding positions of the pin-shaped unit terminals that extract electrical signals from the conductor circuit pattern of the insulating substrate 2.

The insulating circuit substrate (2, 3, 4) on which the semiconductor chips 5*a* to 5*d* are mounted, the upper circuit substrate (7, 8) in which the pin terminals are inserted, and the pin-like terminals for extracting electrical signals are superimposed by using a jig made of carbon or the like. Reflow or the like is used to perform heating, and as illustratively shown by the semiconductor module 101*a* in FIG. 5, the four semiconductor modules 101*a*, 102*a*, 103*a*, 104*a* are joined by solder onto the metal base 1. On such occasion, in the ceramic insulating substrate 2, the lower surface of the rear surface conductive foil 4 where the semiconductor elements (semiconductor chips 5*a*, 5*b*, 5*c*, 5*d*) of the conductor circuit pattern are not mounted and the upper surface of the metal base 1 made of a metal such as Cu or AlSiC are simultaneously bonded together by solder. Nickel (Ni)-phosphorous (P) plating, which has good bonding characteristics with solder, can be applied onto the upper surface of the metal base 1 as necessary.

Figure 6:
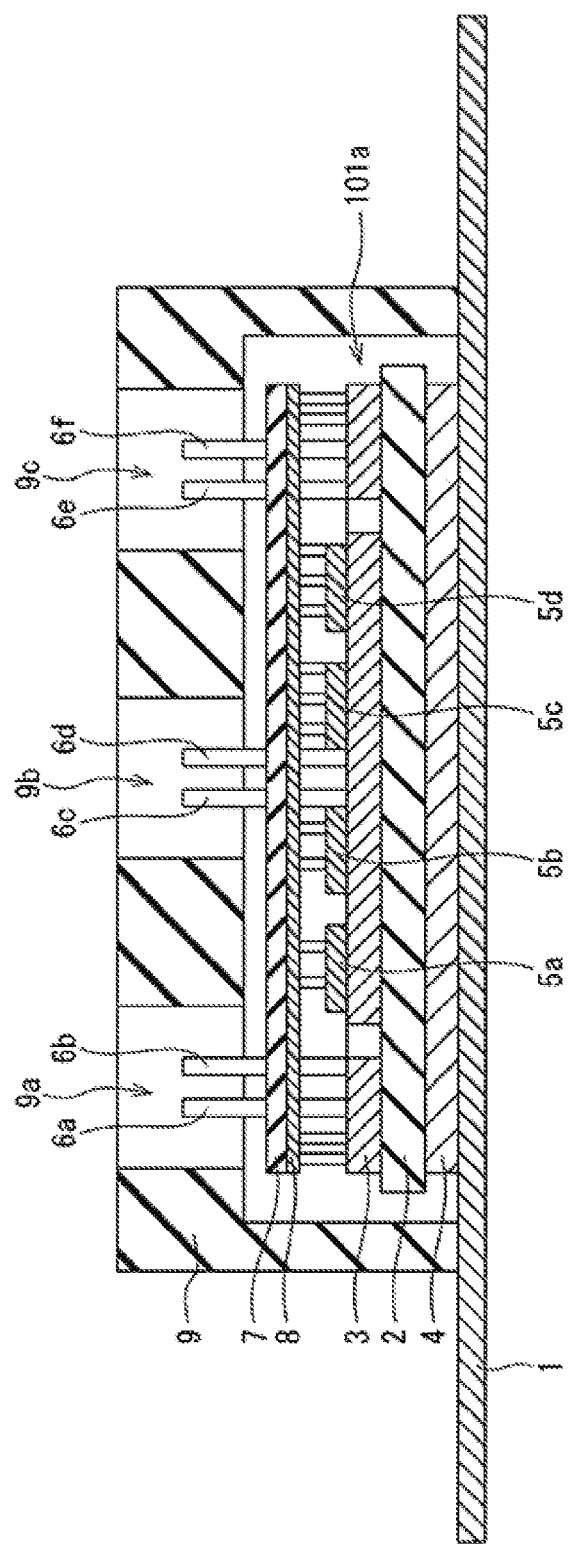
FIG. 6 is a cross-sectional view of a step in the method of manufacturing the semiconductor device according to Embodiment 1 (second example).

Next, the insulating resin frame 9 described using FIG. 2 is fabricated and prepared for each of the semiconductor modules 101*a*, 102*a*, 103*a*, 104*a* by using a mold or the like. As shown in FIG. 6, the prepared insulating resin frame 9 is used to cover the insulating circuit substrate (2, 3, 4), and an adhesive or the like is used to bond the insulating resin frame onto the metal base 1. On the inside of the through-holes in the insulating resin frame 9, the upper ends of first unit terminals 6*a*, 6*b*, 6*g*, 6*h*, second unit terminals 6*c*, 6*d*, 6*i*, 6*j*, and third unit terminals 6*e*, 6*f*, 6*k*, 6*l* of the semiconductor module 101*a* are exposed and protrude. By the beam part being provided between the pair of the through-holes in the insulating resin frame 9, the fourth insulating layer is disposed so as to be separated from each of the terminals between the "one pair of terminals" among the first unit terminals 6a, 6b, 6g, 6h, second unit terminals 6c, 6d, 6i, 6j, and third unit terminals 6e, 6f, 6k, 6l.

Figure 7:
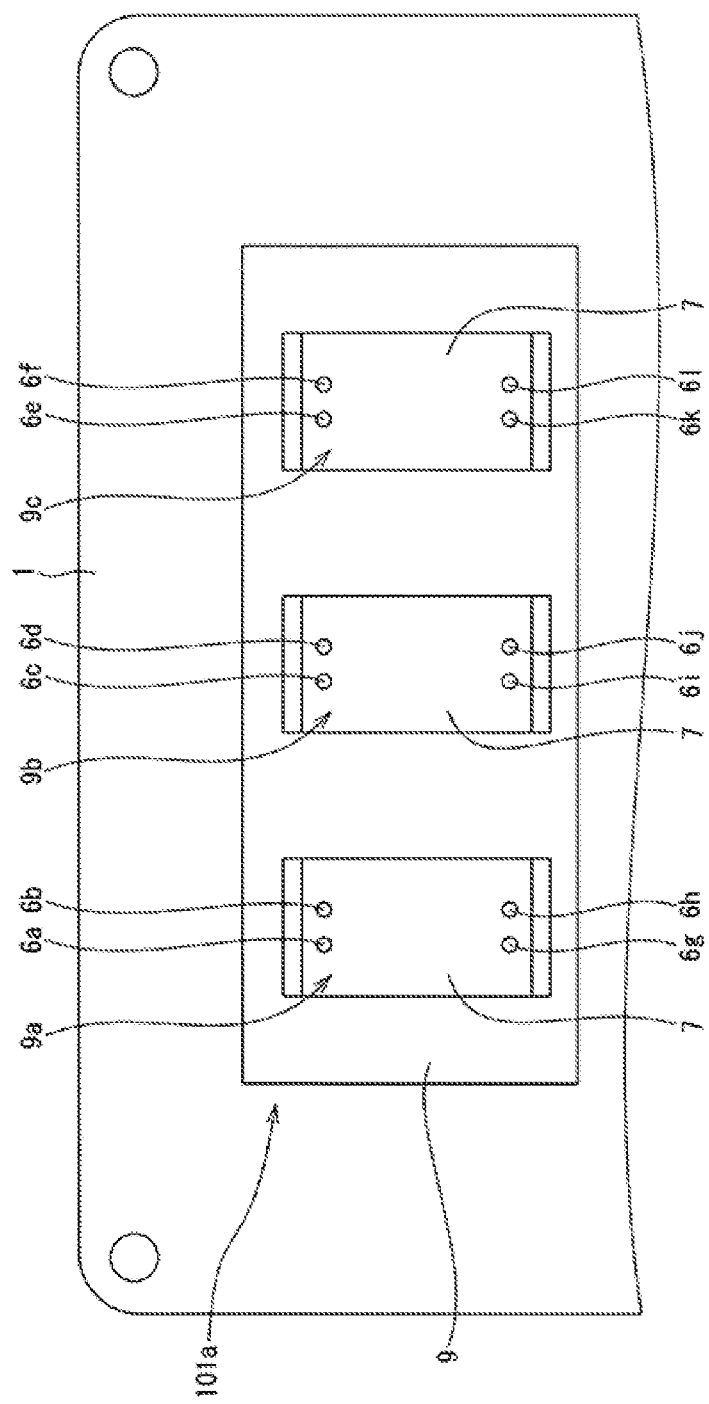
FIG. 7 is a plan view of a step in the method of manufacturing the semiconductor device according to Embodiment 1.

FIG. 7 shows a state in which the upper end surfaces of the four first unit terminals 6a, 6b, 6g, 6h are exposed inside the first through-hole 9a. Furthermore, similarly to inside the first through-hole 9a, the upper end surfaces of the four second unit terminals 6c, 6d, 6i, 6j are exposed inside the second through-hole 9b, and the upper end surfaces of the four third unit terminals 6e, 6f, 6k, 6l are exposed inside the third through-hole 9c. The sidewall parts of the insulating resin frame 9 adjacent to the first unit terminals 6a, 6b, 6g, 6h, second unit terminals 6c, 6d, 6i, 6j, and third unit terminals 6e, 6f, 6k, 6l are arranged as the third insulating layer.

Next, in each of the semiconductor modules 101a, 102a, 103a, 104a, a first insulating resin is injected inside of the insulating resin frame 9 from the respective openings of the first through-hole 9a and second through-hole 9b in the insulating resin frame 9 such that the upper surface of the first insulating resin is positioned lower than the upper ends of the one pair of terminals. The first insulating resin can be a hard thermosetting insulating resin, such as an epoxy resin. The first insulating resin is injected such that the upper ends of both terminals among the "one pair of terminals" are exposed from the upper surface of the first insulating resin.

In other words, the first insulating resin is injected up to a height at which the upper ends of the first unit terminals 6a, 6b, 6g, 6h, second unit terminals 6c, 6d, 6i, 6j, and third unit terminals 6e, 6f, 6k, 6l are not buried, and the upper part of each terminal is exposed on the first insulating resin. Injecting the first insulating resin in a vacuum would make it possible to prevent voids, which are a cause of insulation defects.

Figure 8:
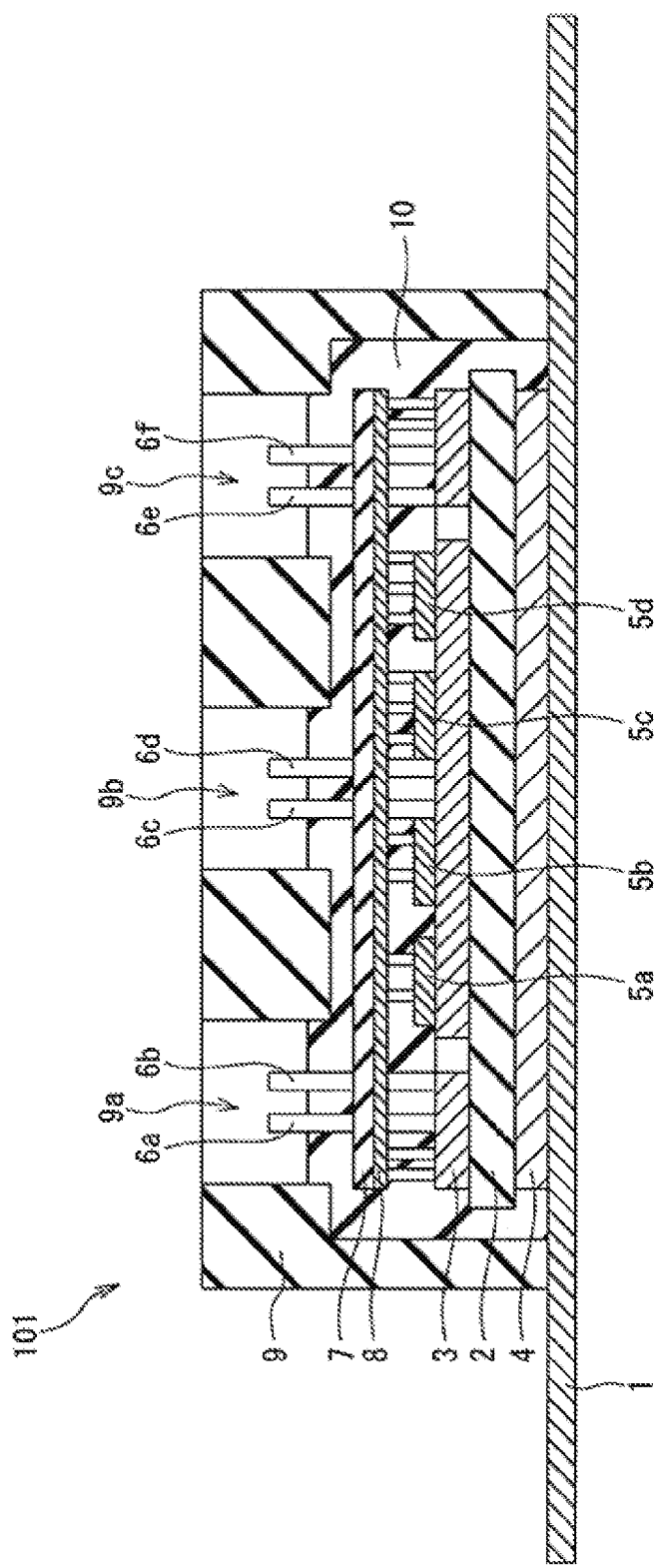
FIG. 8 is a cross-sectional view of a step in the method of manufacturing the semiconductor device according to Embodiment 1 (third example).

Next, heating is performed via an oven or the like, and the first insulating resin is cured to form the first insulating layer 10, as shown in FIG. 8. The upper parts of the first unit terminals 6a, 6b, 6g, 6h, second unit terminals 6c, 6d, 6i, 6j, and third unit terminals 6e, 6f, 6k, 6l are exposed on and protrude above the first insulating layer 10 inside the first through-hole 9a, second through-hole 9b, and third through-hole 9c in the insulating resin frame 9.

Figure 10:
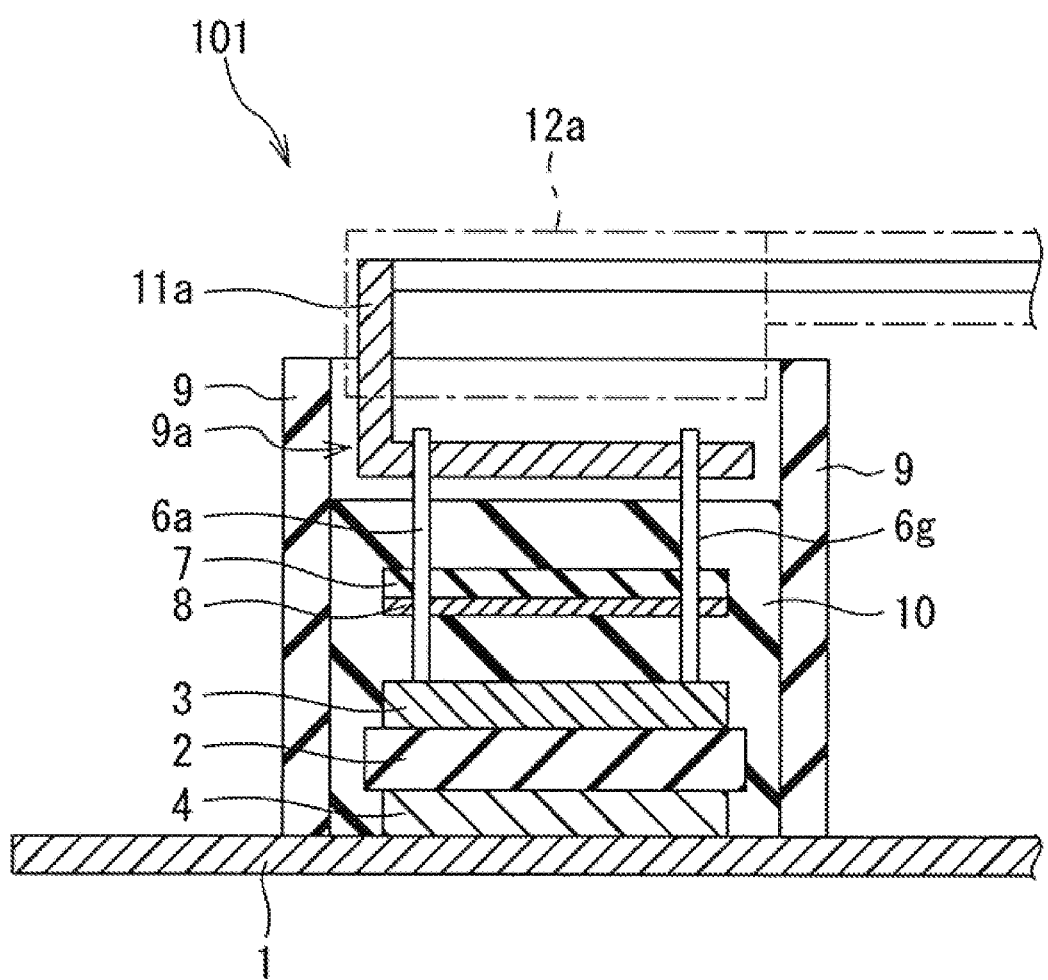
FIG. 10 is a cross-sectional view seen from the direction of the C-C line in FIG. 9.

Next, in order to increase the power capacity of the semiconductor device, the exposed upper parts of the corresponding terminals are electrically connected in parallel among the four semiconductor units 101, 102, 103, 104 provided next to one another on the metal base 1. Specifically, an insulating bus bar, for example, is bridged across and bonded between the respective corresponding terminals of the first unit terminals 6a, 6b, 6g, 6h, second unit terminals 6c, 6d, 6i, 6j, and third unit terminals 6e, 6f, 6k, 6l by laser welding, laser soldering, or the like. The insulating bus bar can be a bus bar where an insulating resin has been selectively molded on the surface thereof, for example. FIG. 9 and FIG. 10 respectively and illustratively show the first insulating bus bar 12a inserted inside the first through-hole 9a and the second through-hole 9b, and the second insulating bus bar 12b inserted inside the third through-hole 9c.

The first insulating bus bar 12a has the conductive connection part 11a integrally connecting the four first unit terminals 6a, 6b, 6g, 6h, and the conductive connection part 11b integrally connecting the four second unit terminals 6c, 6d, 6i, 6j. The second insulating bus bar 12b has the conductive connection part 11c integrally connecting the two third unit terminals 6e, 6k, and the conductive connection part 11d integrally connecting the two third unit terminals 6f, 6k. FIG. 9 and FIG. 10 schematically show the outer edges of the insulating resin molded around the connection part 11a and connection part 11b of the first insulating bus bar 12a as a dashed-dotted line. Furthermore, FIG. 9 schematically shows the outer edges of the insulating resin molded around the connection part 11c and connection part 11d of the second insulating bus bar 12b as a dashed-dotted line.

Figure 11:
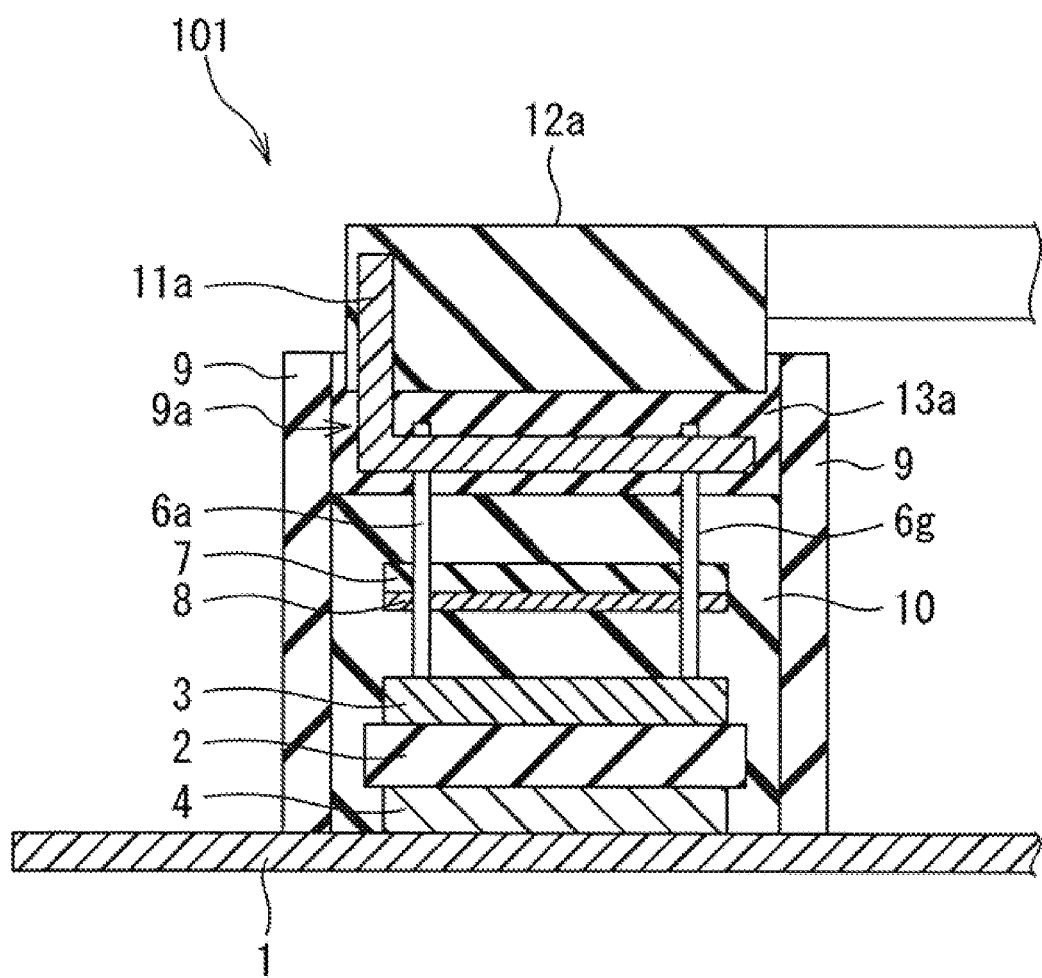
FIG. 11 is a cross-sectional view of a step in the method of manufacturing the semiconductor device according to Embodiment 1 (fifth example).

Next, a second insulating resin is injected inside the insulating resin frame 9 of each of the four semiconductor units 101, 102, 103, 104 such that the upper surface of the second insulating resin is positioned higher than the upper ends of the first unit terminals 6a, 6b, 6g, 6h, second unit terminals 6c, 6d, 6i, 6j, and third unit terminals 6e, 6f, 6k, 6l. The second insulating resin can be a hard thermosetting insulating resin, such as an epoxy resin. The second insulating resin is injected such that the respective upper ends of the first unit terminals 6a, 6b, 6g, 6h, second unit terminal 6c, 6d, 6i, 6j, and third unit terminals 6e, 6f, 6k, 6l are buried inside the second insulating resin. As shown in FIG. 11, the second insulating resin is cured by heating or the like to form the second insulating layer 13a inside the first through-hole 9a. At the same time, the second insulating layer 13b is also formed in the second through-hole 9b, and the second insulating layer 13c is also formed in the third through-hole 9c shown in FIG. 2. The second insulating layers 13a, 13b, 13c resin-seal the first unit terminals 6a, 6b, 6g, 6h, second unit terminals 6c, 6d, 6i, 6j, third unit terminals 6e, 6f, 6k, 6l, and first insulating bus bar 12a. The conductor parts of the second insulating bus bar 12b are completely covered, except for the molded parts of the insulating resin. The area around the semiconductor modules 101a, 102a, 103a, and 104a are all resin-sealed inside the insulating resin frame of each of the four semiconductor units 101, 102, 103, 104, thus obtaining the semiconductor device shown in FIG. 1.

An outer case having holes such that only the conductor parts 22 of the first insulating bus bar 12a and second bus bar 12b protrude to outside is fabricated with an insulating material and prepared as a unit case as necessary. Finally, the prepared outer case is adhered to the metal base 1 to complete the method of manufacturing the semiconductor device according to Embodiment 1, which can be connected to an external device.

The material of the insulating resin frame 9 is preferably the same as the first insulating resin that seals the inside of the semiconductor unit 101, from the viewpoint of improving integration. However, the materials are not limited to being the same material, as long as the thermal expansion coefficients are close to each other and the adhesion strength between the insulating resins is high. Furthermore, the material of the second insulating resin is not limited to being the same material, as long as the thermal expansion coefficient is close to the first insulating resin that seals the inside of the semiconductor unit 101 and the adhesion strength between the insulating resin frame 9 and the second insulating resin is high. It is also not necessary for the thermal expansion coefficients to match each other if using soft sealing resins such as silicone gel, and thus it is also possible to select a soft sealing resin as appropriate, as long as the adhesion strength between the insulating resins is sufficiently ensured.

In the method of manufacturing the semiconductor device according to Embodiment 1 described above, first, the semiconductor modules 101a, 102a, 103a, 104a in a state not having the mold resin are bonded onto the metal base 1 via a high-temperature bonding process. After the high-temperature bonding process has ended, the insulating resin frame 9 is provided around the semiconductor modules 101a, 102a, 103a, 104a via an adhesive, and thus the insulating resin frame 9 does not degrade due to heat.

By injecting the first insulating resin inside the insulating resin frame 9 via the first through-hole 9a, second through-hole 9b, and third through-hole 9c and solidifying the resin, the first insulating layer 10 shown in FIG. 2 is layered. After the corresponding terminals among the four semiconductor units 101, 102, 103, 104 are connected to one another, the second insulating resin is then injected onto the first insulating layer 10 to fill in the first through-hole 9a, second through-hole 9b, and third through-hole 9c with the insulating material and then solidified, thus layering the second insulating layers 13a, 13b, 13c. The sidewall parts of the insulating resin frame 9 form the third insulating layer, and the beam part forms the fourth insulating layer, thus forming, in a composite manner, interfaces from the combination of the first insulating layer 10, second insulating layers 13a, 13b, 13c, third insulating layer, and fourth insulating layer inside the semiconductor unit 101. The formed interfaces make it possible to ensure a large creepage distance between the terminals and between the terminals and ground.

This process of bonding the semiconductor modules 101a, 102a, 103a, 104a onto the metal base 1 and then resin-sealing using the insulating resin frame 9 makes it so there is no degradation at all of the sealing resin caused by the effects of heat, such as in a case where a semiconductor unit that has been resin-sealed beforehand is bonded onto the metal base 1 via a high-temperature heat treatment. Finally, the semiconductor units 101, the entirety of which are integrally resin-sealed and have high insulation breakdown resistance, can be connected in parallel on the metal base 1.

MODIFICATION EXAMPLE 1

Figure 12:
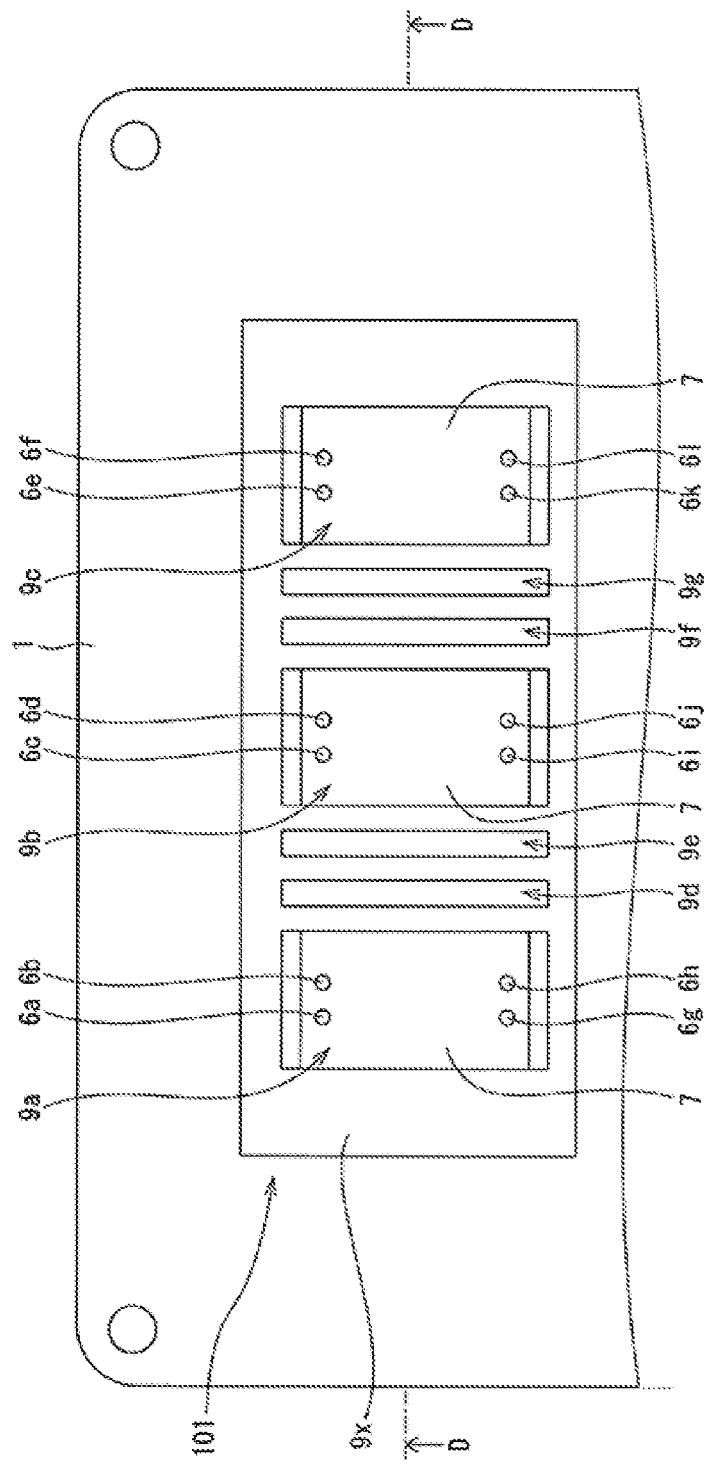
FIG. 12 is a plan view for describing an insulating resin frame used in the semiconductor device according to Modification Example 1 of Embodiment 1.

As shown in FIG. 12, in the semiconductor device according to Modification Example 1 of Embodiment 1, two additional through-holes 9d, 9e are further provided between the first through-hole 9a and the second through-hole 9b in the ceiling part of a rectangular insulating resin frame 9x of the semiconductor unit 101. Two additional through-holes 9f, 9g are also further provided between the second through-hole 9b and the third through-hole 9c of the insulating frame 9x. In other words, a total of seven through-holes (9a, 9b, 9c, 9d, 9e, 9f, 9g) in large size and small size are provided in the ceiling part of the insulating resin frame 9x of the semiconductor device according to Modification Example 1.

The additional through-holes 9d, 9e, 9f, and 9g are all rectangular in a planar pattern and extend along the short-side direction of the insulating resin frame 9x with the same width as the first through-hole 9a, second through-hole 9b, and third through-hole 9c. The additional through-holes 9d, 9e and the additional through-holes 9f, 9g are respectively provided at equal intervals.

Figure 13:
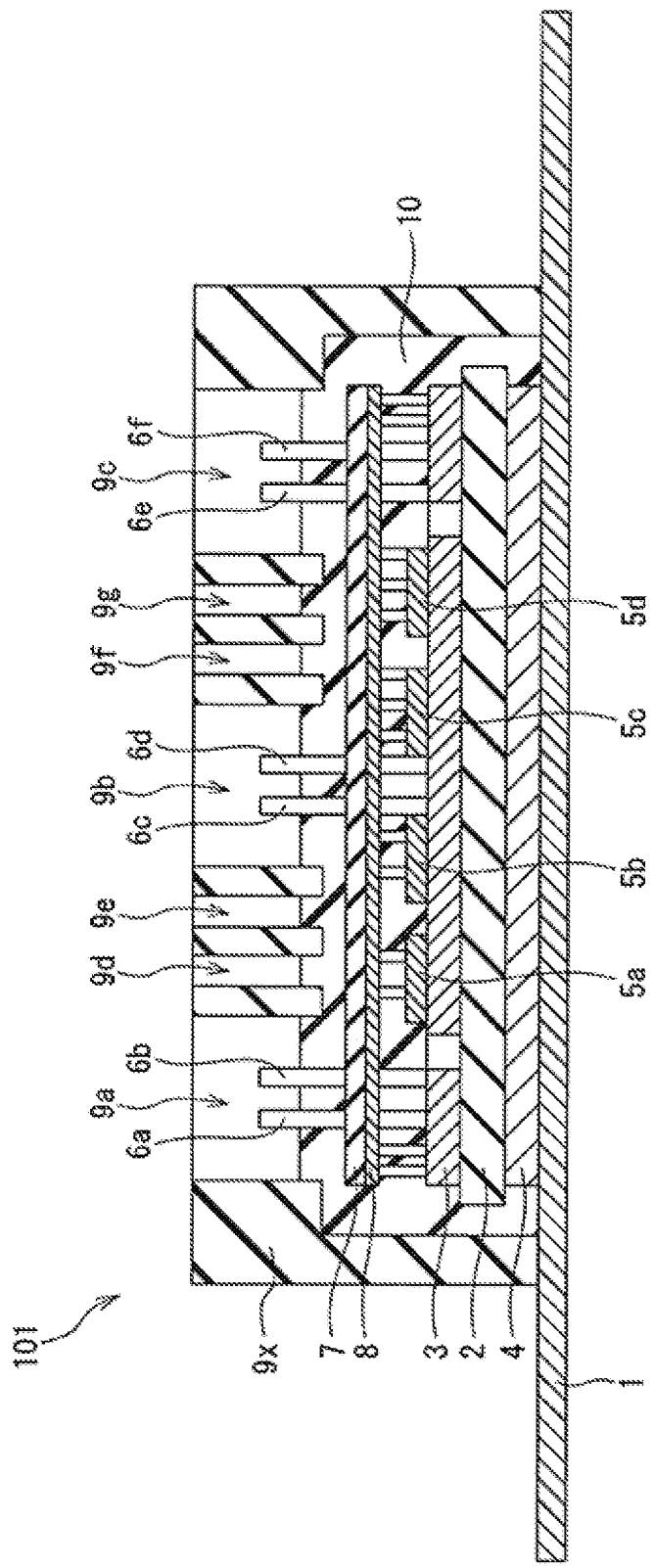
FIG. 13 is a cross-sectional view seen from the direction of the D-D line in FIG. 12.

As shown in FIG. 13, the first insulating layer 10 is also layered inside each of the additional through-holes 9d, 9e, 9f, 9g up to a position that is higher than the height of the lower surface of the ceiling part of the insulating resin frame 9x, similarly to the inside of each of the first through-hole 9a, second through-hole 9b, and third through-hole 9c. Although not shown in the drawing, the second insulating layers are further provided on the first insulating layer 10 inside each of the additional through-holes 9d, 9e, 9f, 9g. Furthermore, similarly to the case shown in FIG. 2, the first unit terminal 6b on the right side inside the first through-hole 9a in FIG. 13 and the second unit terminal 6c on the left side inside the second through-hole 9b form "one pair of terminals" where consideration is given to the insulation breakdown resistance between terminals. The rest of the structure of the semiconductor device according to Modification Example 1 is equivalent to the semiconductor device shown in FIGS. 1 to 11, and thus a redundant description thereof will be omitted.

The semiconductor device according to Modification Example 1 is also provided with the first insulating layer 10, the second insulating layers, the third insulating layer made of the insulating resin frame 9x sidewall parts, and the fourth insulating layer made of the beam part. By combining the beam part of the insulating resin frame 9x, which is the fourth insulating layer, with the first insulating layer 10 and the second insulating layers, it is possible to extend the creepage distance between the "one pair of terminals" even further than the semiconductor unit 101 of the semiconductor device shown in FIG. 3. In particular, in the semiconductor device according to Modification Example 1, increasing the number of through-holes in the ceiling part of the insulating resin frame 9x to seven provides a finer planar pattern of the through-holes in the ceiling part and the beam part. Due to this, it is possible to further extend the creepage distance between the "one pair of terminals." The other effects of the semiconductor device according to Modification Example 1 are similar to the semiconductor device shown in FIGS. 1 to 11.

The number of through-holes in the ceiling part of the insulating resin frame 9x of the semiconductor device according to Modification Example 1 was described as being seven, but the number of through-holes in the ceiling part can also be increased to more than seven, as long as a prescribed strength is maintained for the insulating resin frame. If the planar pattern of the ceiling part has a finer planar structure by increasing the number of through-holes, it is possible to further extend the creepage distance between the "one pair of terminals."

MODIFICATION EXAMPLE 2

Figure 14:
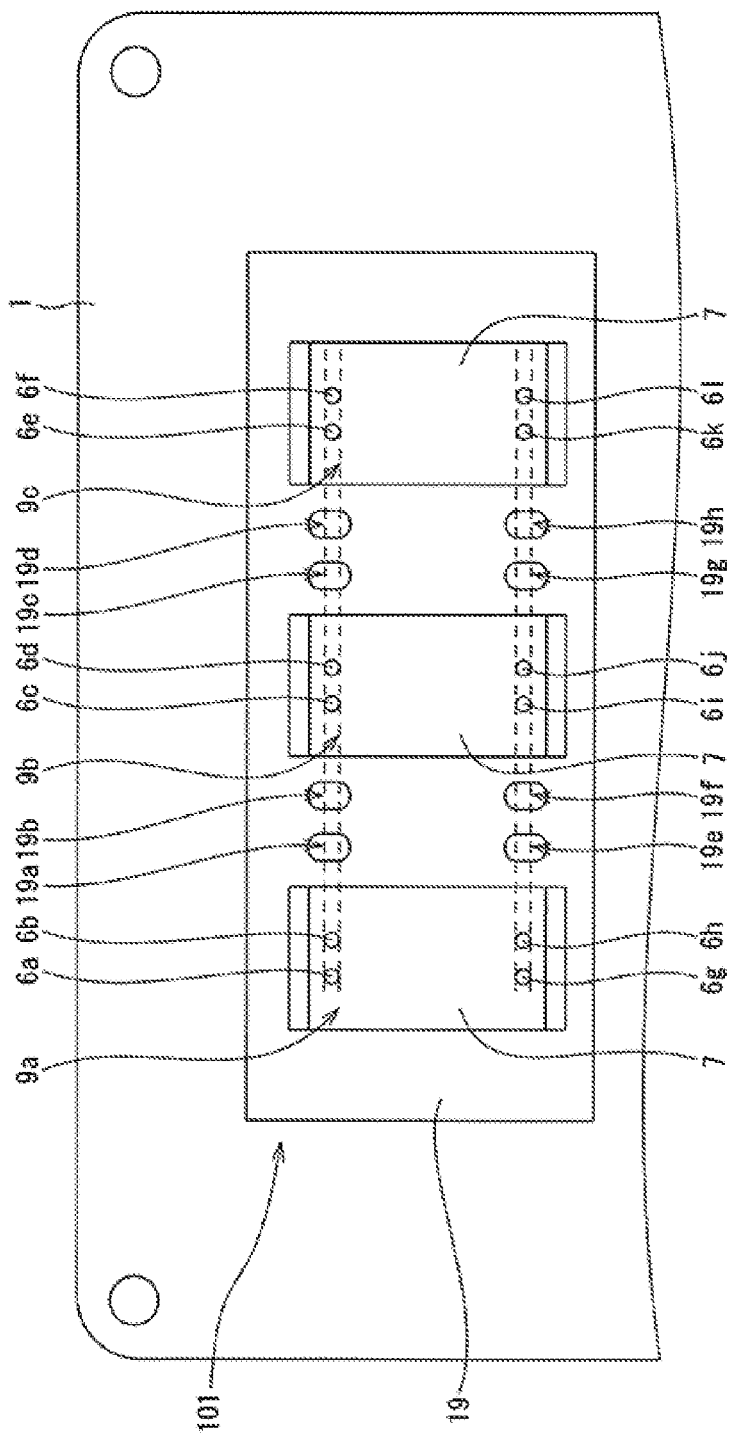
FIG. 14 is a plan view for describing an insulating resin frame used in the semiconductor device according to Modification Example 2 of Embodiment 1.

As shown in FIG. 14, in a rectangular insulating resin frame 19 of the semiconductor unit 101 of the semiconductor device according to Modification Example 2 of Embodiment 1, additional through-holes 19a, 19b, 19e, 19f that are oval-shaped in a planar pattern are provided in the ceiling part between the first-through hole 9a and the second through-hole 9b. Furthermore, oval-shaped additional through-holes 19c, 19d, 19g, 19h are also provided between the second through-hole 9b and the third through-hole 9c. Eleven through-holes 9a, 9b, 9c, 19a, 19b, 19c, 19d, 19e, 19f, 19g, 19h are provided in the ceiling part of the insulating frame resin 19 of the semiconductor device according to Modification Example 2.

The additional through-holes 19a, 19b, 19c, 19d are provided near the long side on the upper side of the rectangular insulating resin frame 19 in FIG. 14 and are provided along the long side on the same straight line as the first unit terminals 6a, 6b, second unit terminals 6c, 6d, and third unit terminals 6e, 6f. Furthermore, the additional through-holes 19e, 19f, 19g, 19h are provided near the long side on the lower side of the insulating resin frame 19 in FIG. 14 and are provided along the long side on the same straight line as the first unit terminals 6g, 6h, second unit terminals 6i, 6j, and third unit terminals 6k, 6l.

As can be understood from the four horizontal broken lines used for description in FIG. 14, the widths of the additional through-holes 19a to 19h are each larger than the widths (the diameters of the circles in the upper surface) of the first unit terminals 6a, 6b, 6g, 6h, second unit terminals 6c, 6d, 6i, 6j, and third unit terminals 6e, 6f, 6k, 6l. However, as long as the planar pattern of the ceiling part of the insulating resin frame 19 is fine-structured, the width of the additional through-holes 19a to 19h may be made smaller than the widths of the first through-hole 9a, second through-hole 9b, and third through-hole 9c. If, when seen from the side, the widths of the additional through-holes 19a, 19b, 19c, 19d, 19e, 19f, 19g, and 19h overlap the widths of the first unit terminals 6a, 6b, 6g, 6h, second unit terminals 6c, 6d, 6i, 6j, and third unit terminals 6e, 6f, 6k, 6l, it is possible to extend the creepage distance between the "one pair of terminals."

Although not shown in the drawings, the first insulating layer 10 is also layered inside each of the oval-shaped additional through-holes 19a, 19b, 19c, 19d up to a position that is higher than the lower surface of the ceiling part of the insulating resin frame 19, similarly to the semiconductor device according to Modification Example 1 shown in FIG. 13. The second insulating layers are further provided on the first insulating layer 10 inside each of the oval-shaped additional through-holes 19a, 19b, 19c, 19d. The rest of the structure of the semiconductor device according to Modification Example 2 is equivalent to the semiconductor device shown in FIGS. 1 to 11, and thus a redundant description thereof will be omitted.

In the semiconductor device according to Modification Example 2 as well, the planar pattern of the ceiling part of the insulating resin frame 19 is miniaturized similarly to the semiconductor device according to Modification Example 1, and thus it is possible to further extend the creepage distance between the one pair of terminals. The other effects of the semiconductor device according to Modification Example 2 are similar to the semiconductor device shown in FIGS. 1 to 11. In order to reliably ensure insulation distance, the shape of the additional through-holes can be selected as appropriate from among a rectangular shape, circular shape, oval shape, or the like, as long as the widths of the additional through-holes overlap the widths of the first unit terminals 6a, 6b, 6g, 6h, second unit terminals 6c, 6d, 6i, 6j, and third unit terminals 6e, 6f, 6k, 6l when seen from the side.

MODIFICATION EXAMPLE 3

Figure 15:
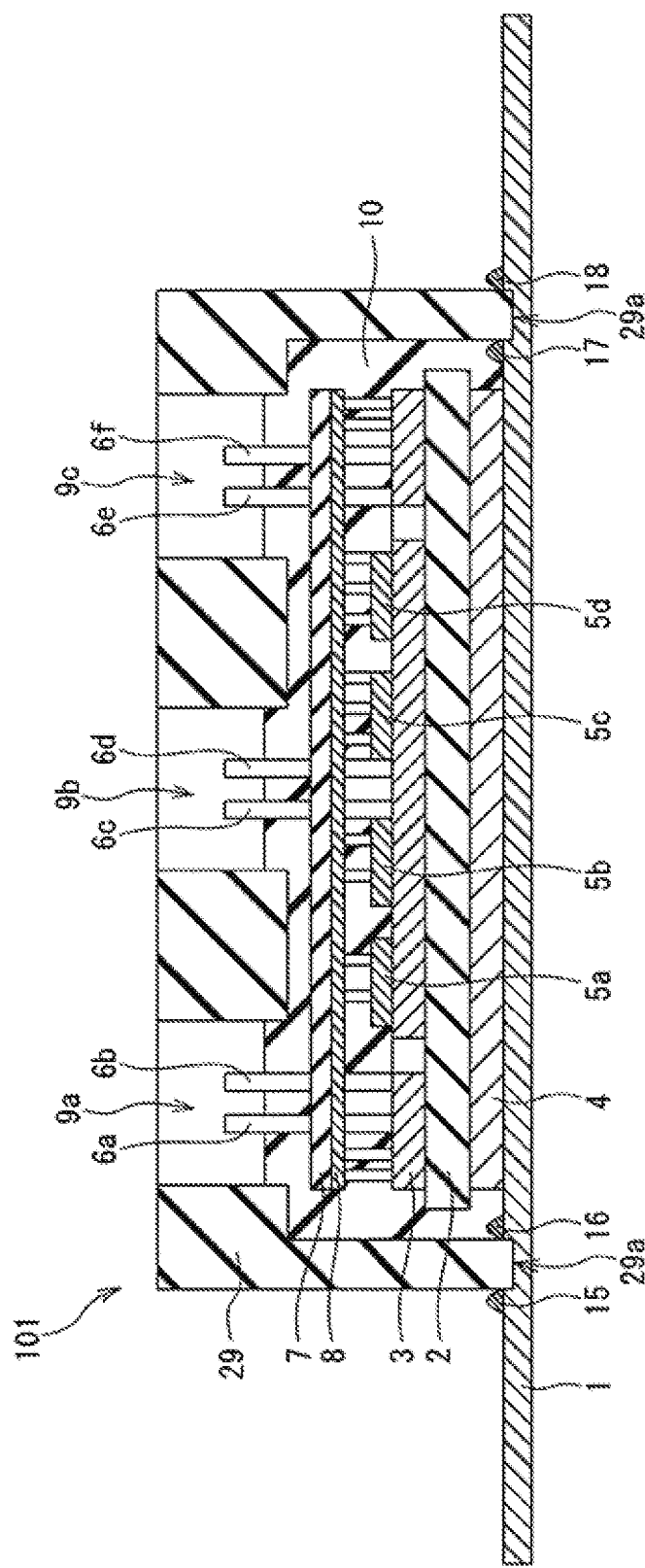
FIG. 15 is a cross-sectional view for describing an insulating resin frame and a metal base used in the semiconductor device according to Modification Example 3 of Embodiment 1.

As shown in FIG. 15, grooves 29a in which fit the lower ends of the sidewall parts of an insulating resin frame 29 are provided on the upper surface of the metal base 1 to which the semiconductor unit 101 of the semiconductor device according to Modification Example 3 of Embodiment 1 is bonded. Protrusions 15, 16, 17, 18, which are raised so as to sandwich the lower ends of the sidewall parts of the insulating resin frame 29, are provided on both sides of the grooves 29a on the upper surface of the metal base 1 in the thickness direction of the sidewall parts of the insulating resin frame 29.

An adhesive, for example, is coated inside the grooves 29a on the upper surface of the metal base 1, and the insulating resin frame 29 and the metal base 1 are bonded to each other via this adhesive. The protrusions 15, 16, 17, 18 all protrude toward the insulating resin frame on the upper side and support the sidewall parts by respectively contacting the lower parts of the inner wall surface or outside surface of the sidewall parts of the insulating resin frame 29. The rest of the structure of the semiconductor device according to Modification Example 3 is equivalent to the semiconductor device shown in FIGS. 1 to 11, and thus a redundant description thereof will be omitted.

In the semiconductor device according to Modification Example 3 as well, by connecting a plurality of the semiconductor units 101 with improved insulation breakdown resistance in parallel, it is possible to realize a semiconductor device that maintains high heat resistance and insulation and that has a high withstand voltage and large power capacity. Moreover, the semiconductor device according to Modification Example 3 facilitates positioning work of the insulating resin frame 29 on the metal base 1 by using the grooves 29a and the protrusions 15, 16, 17, 18 provided on the upper surface of the metal base 1. Furthermore, it is possible to improve integration between the metal base 1 and the insulating resin frame 29. The other effects of the semiconductor device according to Modification Example 3 are similar to the semiconductor device shown in FIGS. 1 to 11.

It is possible to use only either the grooves 29a or the protrusions 15, 16, 17, 18, and the positions where the protrusions 15, 16, 17, 18 are provided are also not limited to being the lower parts of all four sidewall parts of the insulating resin frame 29, but rather can be the lower part of any one of the sidewall parts, or selected as appropriate. The material of the protrusions 15, 16, 17, 18 may be the same metal material as the metal base 1 or may be a different material.

MODIFICATION EXAMPLE 4

Figure 16:
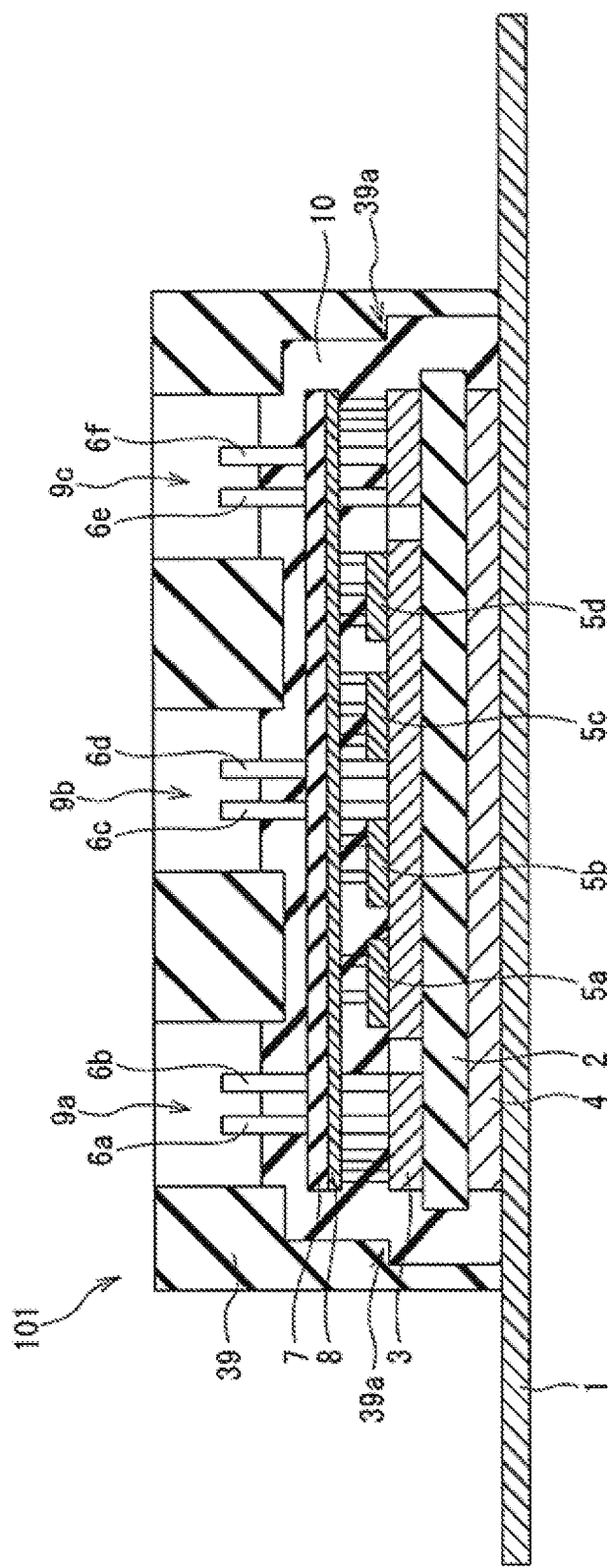
FIG. 16 is a cross-sectional view for describing an insulating resin frame used in the semiconductor device according to Modification Example 4 of Embodiment 1.

As shown in FIG. 16, a step 39a, of which the thickness on the lower side is less than the thickness on the upper side, is provided on the lower parts of the sidewall parts of the insulating resin frame 39 of the semiconductor unit 101 of the semiconductor device according to Modification Example 4 of Embodiment 1. In a case where the insulating resin frame 39 is fabricated by molding with a mold, for example, consideration is given to the shape of the step 39a becoming thinner from the inside toward the outside so that the product is easy to remove from the mold, and a section thicker than the upper side is not provided on the lower side. The rest of the structure of the semiconductor device according to Modification Example 4 is equivalent to the semiconductor device shown in FIGS. 1 to 11, and thus a redundant description thereof will be omitted.

In the semiconductor device according to Modification Example 4 as well, by connecting a plurality of the semiconductor units 101 with improved insulation breakdown resistance in parallel, it is possible to realize a semiconductor device that maintains high heat resistance and insulation and that has a high withstand voltage and large power capacity. Furthermore, the semiconductor device according to Modification Example 4 uses the step 39a provided on the lower parts of the sidewall parts of the insulating resin frame 39 to extend the creepage distance, which is the insulation distance between the terminals and ground, and thus it is possible to further improve the insulation breakdown resistance. The other effects of the semiconductor device according to Modification Example 4 are similar to the semiconductor device shown in FIGS. 1 to 11. In FIG. 16, a case is illustratively shown in which one step 39a is provided, but the number of steps 39a may be two or more.

MODIFICATION EXAMPLE 5

Figure 17:
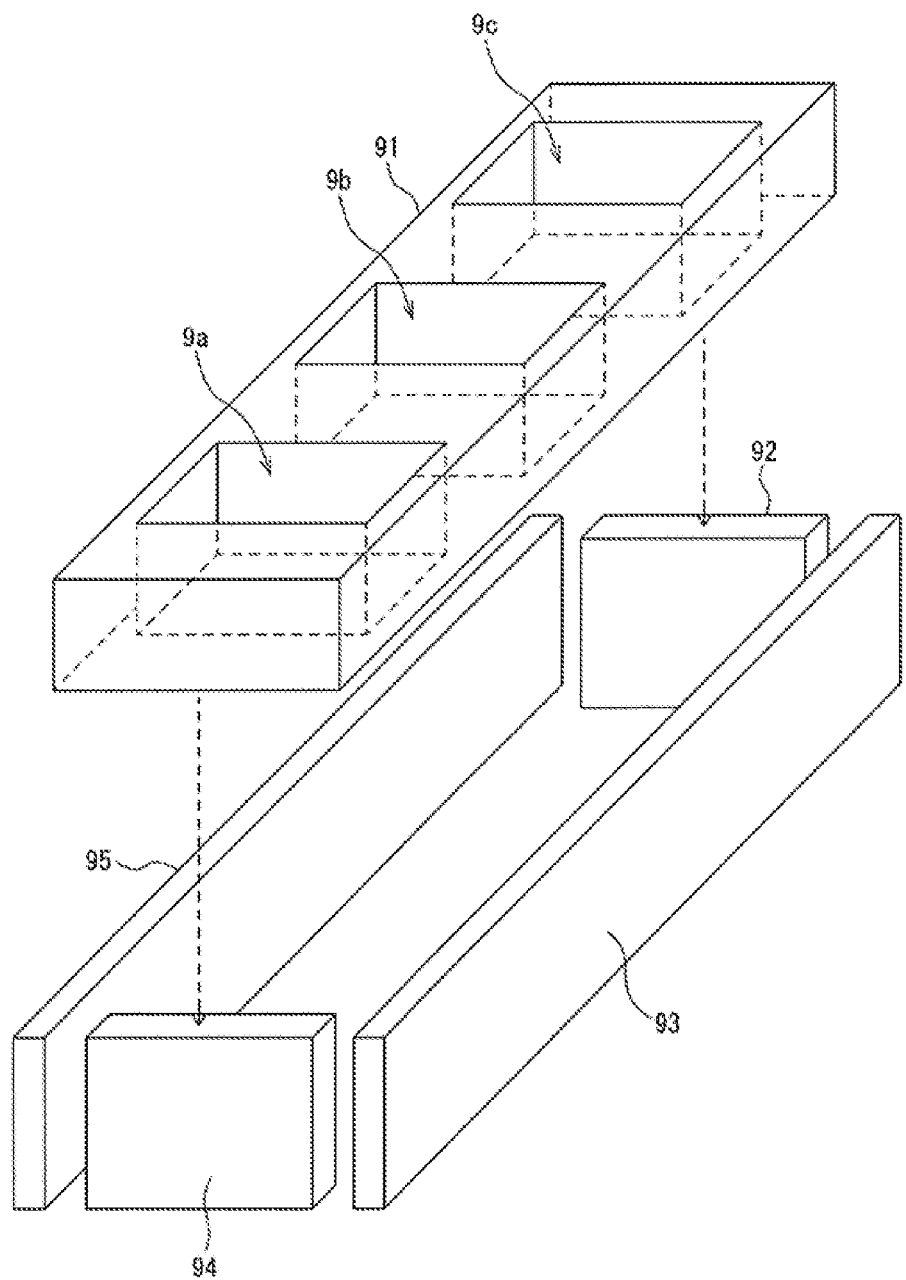
FIG. 17 is an exploded perspective view for describing an insulating resin frame used by the semiconductor device according to Modification Example 5 of Embodiment 1.

As shown in FIG. 17, in the insulating resin frame (91, 92, 93, 94, 95) of the semiconductor unit of the semiconductor device according to Modification Example 5 of Embodiment 1, the four sidewall parts 92, 93, 94, 95 are separate members from the ceiling part 91 provided on and covering the top of the four sidewall parts 92, 93, 94, 95. The ceiling part 91 is provided with the first through-hole 9a, second through-hole 9b, and third through-hole 9c, similarly to the semiconductor device according to FIGS. 1 to 11.

As shown in FIG. 17, the four wall parts 92, 93, 94, 95, and the ceiling part 91 are integrated by being tightly bonded together using an adhesive, for example, such that the resin inside does not leak out, thus realizing the insulating resin frame used by the semiconductor device of the present invention. Preparing the insulating resin frame, which is cuboid-shaped and box-like when integrated, by dividing the insulating resin frame into simple plate-shaped structure members beforehand as in the four sidewall parts 92, 93, 94, 95 and the ceiling part 91 illustratively shown in FIG. 17, increases the versatility of the members and is advantageous for manufacturing. For example, it is possible to prevent an inventory of excess members by modifying the height of only sidewall parts and then using inventory for a ceiling part that does not require the dimensions thereof to be modified, or by modifying the length of long-side direction sidewall parts and the ceiling part and then using inventory for short-side direction sidewall parts that do not require the dimensions thereof to be modified. The other effects of the semiconductor device according to Modification Example 5 are similar to the semiconductor device shown in FIGS. 1 to 11.

Embodiment 2

—Semiconductor Device—

Figure 18:
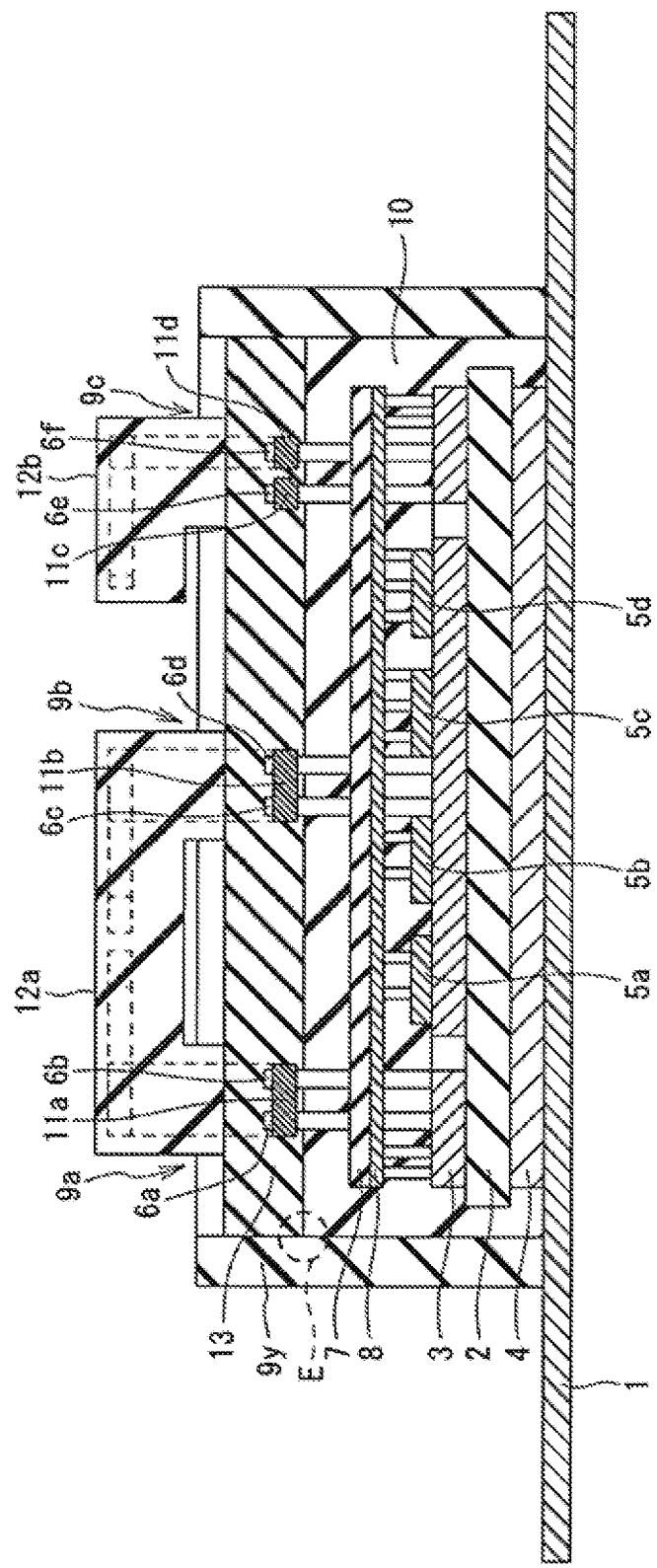
FIG. 18 is a cross-sectional view seen from the direction of the F-F line in FIG. 19.

A semiconductor device according to Embodiment 2 of the present invention includes a metal base 1 and four semiconductor units bonded onto the metal base 1, similarly to the semiconductor units 101, 102, 103, 104 shown in FIG. 1. FIG. 18 illustratively shows the internal structure of one semiconductor unit among the four semiconductor units. The semiconductor units each include an insulating circuit substrate (2, 3, 4), and semiconductor chips 5a, 5b, 5c, 5d mounted on the insulating circuit substrate (2, 3, 4). The semiconductor chips 5a, 5b, 5c, 5d are electrically connected to an upper circuit substrate (7, 8) by pin terminals extending from the lower surface of the upper circuit substrate (7, 8).

As shown in in FIG. 18 and FIG. 19, rod-shaped first unit terminals 6a, 6b, 6g, 6h, second unit terminals 6c, 6d, 6i, 6j, and third unit terminals 6e, 6f, 6k, 6l are provided on the insulating circuit substrate (2, 3, 4), connect to the semiconductor chips 5a, 5b, 5c, 5d, and extend to the upper side. A cuboid-shaped box-like insulating resin frame 9y is provided around the insulating circuit substrate (2, 3, 4).

As shown in FIG. 18 and FIG. 19, the insulating resin frame 9y is a frame shape where the outer edges are rectangular in a planar pattern, there is no region corresponding to a ceiling part, and the upper part of the insulating resin frame 9y has the entire surface thereof open. In other words, the semiconductor device according to Embodiment 2 differs from the semiconductor device according to Embodiment 1 in not being provided with the beam part of the ceiling part as the fourth insulating layer, but rather only having the sidewall parts of the insulating resin frame 9y as the third insulating layer. In FIG. 19, for convenience of explanation, the members above the upper circuit substrate (7, 8) such as the first insulating member 10 are omitted from the drawing, and the upper end surfaces of the first unit terminals 6a, 6b, 6g, 6h, second unit terminals 6c, 6d, 6i, 6j, and third unit terminals 6e, 6f, 6k, 6l are shown. As shown in FIG. 18, a first insulating bus bar 12a and a second insulating bus bar 12b are provided in the opening in the insulating resin frame 9y.

As shown in FIG. 18, the first insulating layer 10 is provided inside the insulating resin frame 9y so as to seal the insulating circuit substrate (2, 3, 4) and the upper circuit substrate (7, 8). The first insulating layer 10 includes the lower portions of the first unit terminals 6a, 6b, 6g, 6h, second unit terminals 6c, 6d, 6i, 6j, and third unit terminals 6e, 6f, 6k, 6l, and the upper part of each protrudes to above the upper surface of the first insulating layer 10. The second insulating layer 13 is provided on the upper surface of the first insulating layer 10 so as to seal the upper portions of the first unit terminals 6a, 6b, 6g, 6h, second unit terminals 6c, 6d, 6i, 6j, and third unit terminals 6e, 6f, 6k, 6l. The first insulating layer, second insulating layer 13, and sidewall parts of the insulating resin frame 9y are adhered to each other and bonded at a sufficient strength.

The rest of the structure of the semiconductor device according to Embodiment 2 is equivalent to the members of the same name in the semiconductor device of Embodiment 1, and thus a redundant description thereof will be omitted. Even in a case where the beam part, which is the fourth insulating layer, is not present, as with the semiconductor device according to Embodiment 2, the interfaces are formed between the sidewall parts of the insulating resin frame 9y, which are the third insulating layer, and the first insulating layer and second insulating layer 13, as shown by section E in FIG. 18. The creepage distance between the terminals and ground can be extended with the formed interfaces.

—Method of Manufacturing Semiconductor Device—

In a method of manufacturing the semiconductor device according to Embodiment 2, first, a semiconductor module not having a mold resin is bonded onto the metal base 1 via a high-temperature bonding process, similarly to the method of manufacturing the semiconductor device according to Embodiment 1. Thereafter, the insulating resin frame 9y is provided around the semiconductor module via an adhesive. The first insulating resin is injected inside the insulating resin frame 9y via the openings in the upper side up to a position that is lower than the upper ends of the first unit terminals 6a, 6b, 6g, 6h, second unit terminals 6c, 6d, 6i, 6j, and third unit terminals 6e, 6f, 6k, 6l. The injected first insulating resin is then solidified to layer the first insulating layer 10 shown in FIG. 18.

The corresponding terminals among the four semiconductor units are connected in parallel to one another on the metal base 1 by using the first insulating bus bar 12a and the second insulating bus bar 12b, and thereafter the second insulating resin is injected on the first insulating layer 10. The second insulating resin is injected such that the respective upper ends of the first unit terminals 6a, 6b, 6g, 6h, second unit terminals 6c, 6d, 6i, 6j, and third unit terminals 6e, 6f, 6k, 6l are covered. By injecting and solidifying the second insulating resin, the second insulating layer 13 is layered inside the insulating resin frame 9y. Inside the semiconductor unit, the sidewall parts of the insulating resin frame 9y forming the third insulating layer combine with the first insulating layer 10 and second insulating layer 13 to form the interfaces. The formed interfaces ensure a large creepage distance between each of the first unit terminals 6a, 6b, 6g, 6h, second unit terminals 6c, 6d, 6i, 6j, third unit terminals 6e, 6f, 6k, 6l, and ground.

In the method of manufacturing the semiconductor device according to Embodiment 2 as well, semiconductor units, the entirety of which are resin-sealed and have improved insulating breakdown resistance, can be ultimately connected in parallel on the metal base 1 without causing degradation of the sealing resin during the high-temperature bonding onto the metal base 1, similarly to Embodiment 1. Furthermore, in the method of manufacturing the semiconductor device according to Embodiment 2, the ceiling part of the insulating resin frame 9y in which the first through-hole 9a, second through-hole 9b, and third through-hole 9c are formed is not necessary, and thus it is possible to suppress material costs and simplify the manufacturing process.

OTHER EMBODIMENTS

The present invention was described by the embodiments disclosed above, but the description and drawings that form a part of the disclosure should not be construed as limiting the present invention. Various substitute embodiments, working examples, and uses shall be clear to a person skilled in the art from the present disclosure.

For example, a combination pattern of the first insulating layer 10, second insulating layers 13a, 13b, and the beam part of the insulating resin frame 9 as the fourth insulating layer illustratively shown in FIG. 3 will be considered. In the case of the semiconductor device shown in FIG. 3, among the two creepage distances formed on the upper side and lower side of the beam part, the creepage distance on the lower side was shorter than the creepage distance on the upper side. However, in the semiconductor device according to the present invention, the combination pattern of the first insulating layer 10, second insulating layers 13a, 13b, and beam part of the insulating resin frame 9 serving as the fourth insulating layer is not limited to the combination pattern of FIG. 3.

For example, it is also possible to make the creepage distance on the lower side of the beam part longer than the creepage distance on the upper side by arranging the upper surface of the first insulating layer 10 higher than the upper surface position shown in FIG. 3, along with making the thickness of the beam part of the ceiling part of the insulating resin frame 9 thinner than shown in FIG. 3. By making the creepage distance on the lower side of the beam part longer than the creepage distance on the upper side, it is possible to improve the insulation breakdown resistance in a case where a crack or detachment has occurred at the lower side position of the beam part inside the first insulating layer 10.

The semiconductor device of the present invention can be realized even when parts of the structure of the semiconductor devices shown in FIGS. 1 to 19 are combined. As described above, the present invention includes various embodiments etc. not disclosed above, and the technical scope of the present invention is determined solely by the invention-defining matters within a reasonable scope of the claims from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
  a conductor base;
  a plurality of identical semiconductor units mounted on the conductor base, each of the semiconductor units comprising a semiconductor module and a box-shaped insulating resin frame that encloses the semiconductor module; and
  a bus bar connecting the plurality of semiconductor units in parallel to each other,
  wherein the semiconductor module comprises:
    an insulating circuit substrate mounted on the conductor base,
    semiconductor chips mounted on the insulating circuit substrate, and
    rod-shaped terminals provided on the insulating circuit substrate and connected to the semiconductor chips, the rod-shaped terminals vertically extending upwardly away from the conductor base,
  wherein the box-shaped insulating resin frame is mounted on the conductor base so as to enclose the semiconductor module, and the conductor base in contact with a bottom of a sidewall of the insulating resin frame is a grounded portion,
  wherein each of the semiconductor units further comprises:
    a first insulating member that fills in a space defined by the insulating resin frame and the semiconductor module enclosed therein so as to seal the semiconductor module, an upper surface of the first insulating member being positioned at a level that is lower than upper end portions of the rod-shaped terminals, thereby exposing the upper end portions of the respective rod-shaped terminals from the first insulating member, the exposed upper end portions of the respective rod-shaped being connected to the bus bar; and
    a second insulating member that fills in an inside of the insulating resin frame on the first insulating member so as to seal and bury the upper end portions of the rod-shaped terminals that are connected to the bus bar, and
  wherein in each of the semiconductor units, one or more of an interface between the first insulating member and the second insulating member, an interface between the first insulating member and the insulating resin frame, and an interface between the second insulating member and the insulating resin frame are arranged between two adjacent ones of the rod-shaped terminals and between any of the rod-shaped terminals and the grounded portion.

2. The semiconductor device according to claim 1, wherein in each of the semiconductor units:
  the insulating resin frame further has a ceiling part that has a beam part and a pair of through-holes formed on both sides of the beam part;
  in a plan view, one of the rod-shaped terminals is located within one of the through-holes and another one of the rod-shaped terminals that is next to said one of the rod-shaped terminals is located within another of the through-holes; and
  the interface between the first insulating member and the second insulating member, an interface between the first insulating member and the beam part of the ceiling part of the insulating resin frame, and an interface between the second insulating member and the beam part of the ceiling part of the insulating resin frame are arranged between said one of the rod-shaped terminals and said another one of the rod-shaped terminals.

3. The semiconductor device according to claim 2, wherein the conductor base has a groove to receive a lower end of the sidewall of the insulating resin frame or protrusions to support the lower end of the sidewall of the insulating resin frame from both sides.

4. The semiconductor device according to claim 3, wherein the sidewall of the insulating resin frame has a step that divides a lower part and an upper part of the sidewall, the lower part being thinner than the upper part.

5. The semiconductor device according to claim 2, wherein the sidewall of the insulating resin frame has a step that divides a lower part and an upper part of the sidewall, the lower part being thinner than the upper part.

6. The semiconductor device according to claim 2, wherein a creepage that is a length of a path that follows the interfaces arranged between said one of the rod-shaped terminals and said another one of the rod-shaped terminals is greater than a horizontal distance between said one of the rod-shaped terminals and said another one of the rod-shaped terminals for enhanced insulation.

7. The semiconductor device according to claim 1, wherein the conductor base has a groove to receive a lower end of the sidewall of the insulating resin frame or protrusions to support the lower end of the sidewall of the insulating resin frame from both sides.

8. The semiconductor device according to claim 7, wherein the sidewall of the insulating resin frame has a step that divides a lower part and an upper part of the sidewall, the lower part being thinner than the upper part.

9. The semiconductor device according to claim 1, wherein the sidewall of the insulating resin frame has a step that divides a lower part and an upper part of the sidewall, the lower part being thinner than the upper part.

10. The semiconductor device according to claim 1, wherein a rated voltage of the semiconductor device is 3.3 kV or higher.

11. A method of manufacturing a semiconductor device, comprising:
mounting, on a conductor base, a plurality of identical semiconductor modules, each of the semiconductor modules comprising an insulating circuit substrate, semiconductor chips mounted on the insulating circuit substrate, and rod-shaped terminals provided on the insulating circuit substrate and connected to the semiconductor chips, the rod-shaped terminals vertically extending upwardly away from the conductor base;
arranging a plurality of box-shaped insulating resin frame on the conductor base so as to respectively enclose the semiconductor modules and bonding the insulating resin frames to the conductor base;
in each of the insulating resin frames, forming a first insulating member that fills in a space defined by the insulating resin frame and the semiconductor module enclosed therein so as to seal the semiconductor module, an upper surface of the first insulating member being positioned at a level that is lower than upper end portions of the rod-shaped terminals, thereby exposing the upper end portions of the respective rod-shaped terminals from the first insulating member;
connecting the exposed upper end portions of the corresponding rod-shaped terminals of the plurality of semiconductor module by a bus bar so as to connect the plurality of semiconductor modules in parallel to each other; and
in each of the insulating resin frames, forming a second insulating member that fills in an inside of the insulating resin frame on the first insulating member so as to seal and bury the upper end portions of the rod-shaped terminals that are connected to the bus bar,
wherein the method is performed such that in each of the insulating resin frames, one or more of an interface between the first insulating member and the second insulating member, an interface between the first insulating member and the insulating resin frame, and an interface between the second insulating member and the insulating resin frame are arranged between two adjacent ones of the rod-shaped terminals and between any of the rod-shaped terminals and a grounded portion.

12. The method of manufacturing the semiconductor device according to claim 11, wherein the method is performed such that:
the insulating resin frame further has a ceiling part that has a beam part and a pair of through-holes formed on both sides of the beam part;
in a plan view, one of the rod-shaped terminals is located within one of the through-holes and another one of the rod-shaped terminals that is next to said one of the rod-shaped terminals is located within another of the through-holes; and
the interface between the first insulating member and the second insulating member, an interface between the first insulating member and the beam part of the ceiling part of the insulating resin frame, and an interface between the second insulating member and the beam part of the ceiling part of the insulating resin frame are arranged between said one of the rod-shaped terminals and said another one of the rod-shaped terminals.

13. The method of manufacturing the semiconductor device according to claim 12, wherein the connecting of the upper end portions of the terminals is performed after the forming of the first insulating member and before the forming of the second insulating member.

14. The method of manufacturing the semiconductor device according to claim 12, wherein a creepage that is a length of a path that follows the interfaces arranged between said one of the rod-shaped terminals and said another one of the rod-shaped terminals is greater than a horizontal distance between said one of the rod-shaped terminals and said another one of the rod-shaped terminals for enhanced insulation.

15. The method of manufacturing the semiconductor device according to claim 11, wherein the connecting of the upper end portions of the terminals is performed after the forming of the first insulating member and before the forming of the second insulating member.

* * * * *